(12) United States Patent
Wu et al.

(10) Patent No.: US 10,867,848 B2
(45) Date of Patent: Dec. 15, 2020

(54) SEMICONDUCTOR DEVICE AND METHOD

(71) Applicant: Taiwan Semiconductor Manufacturing Company, Ltd., Hsinchu (TW)

(72) Inventors: Chung-Chiang Wu, Taichung (TW); Hsueh Wen Tsau, Zhunan Township (TW); Chia-Ching Lee, New Taipei (TW); Cheng-Lung Hung, Hsinchu (TW); Ching-Hwanq Su, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/967,497

(22) Filed: Apr. 30, 2018

(65) Prior Publication Data
US 2019/0333808 A1     Oct. 31, 2019

(51) Int. Cl.
| H01L 21/70 | (2006.01) |
| H01L 21/768 | (2006.01) |
| H01L 29/66 | (2006.01) |
| H01L 23/532 | (2006.01) |
| H01L 29/78 | (2006.01) |
| H01L 23/535 | (2006.01) |

(52) U.S. Cl.
CPC .... *H01L 21/76871* (2013.01); *H01L 21/7684* (2013.01); *H01L 21/76805* (2013.01); *H01L 21/76843* (2013.01); *H01L 21/76862* (2013.01); *H01L 21/76889* (2013.01); *H01L 21/76895* (2013.01); *H01L 23/535* (2013.01); *H01L 23/53266* (2013.01); *H01L 29/66795* (2013.01); *H01L 29/7851* (2013.01)

(58) Field of Classification Search
CPC ........... H01L 21/76871; H01L 21/7684; H01L 29/7851; H01L 21/76895; H01L 21/76889; H01L 23/535; H01L 21/76862; H01L 21/76843; H01L 21/76805; H01L 29/66795; H01L 23/53266
See application file for complete search history.

(56) References Cited

U.S. PATENT DOCUMENTS

| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |

(Continued)

*Primary Examiner* — Didarul A Mazumder
*Assistant Examiner* — Wasiul Haider
(74) *Attorney, Agent, or Firm* — Slater Matsil, LLP

(57) ABSTRACT

A method includes forming an opening in a dielectric layer, depositing a seed layer in the opening, wherein first portions of the seed layer have a first concentration of impurities, exposing the first portions of the seed layer to a plasma, wherein after exposure to the plasma the first portions have a second concentration of impurities that is less than the first concentration of impurities, and filling the opening with a conductive material to form a conductive feature. In an embodiment, the seed layer includes tungsten, and the conductive material includes tungsten. In an embodiment, the impurities include boron.

20 Claims, 24 Drawing Sheets

(56) References Cited

U.S. PATENT DOCUMENTS

| | | |
|---|---|---|
| 9,520,482 B1 | 12/2016 | Chang et al. |
| 9,576,814 B2 | 2/2017 | Wu et al. |
| 2014/0084340 A1* | 3/2014 | Wang .................... H01L 21/285 |
| | | 257/190 |
| 2015/0235954 A1* | 8/2015 | Chang ............... H01L 23/53238 |
| | | 257/751 |
| 2017/0194204 A1* | 7/2017 | Sowa ................ H01L 21/76898 |
| 2018/0211872 A1* | 7/2018 | Wu ................... H01L 21/76846 |
| 2018/0301458 A1* | 10/2018 | Chen ................ H01L 27/10855 |
| 2018/0342614 A1* | 11/2018 | Bergendahl ......... H01L 29/7827 |

* cited by examiner

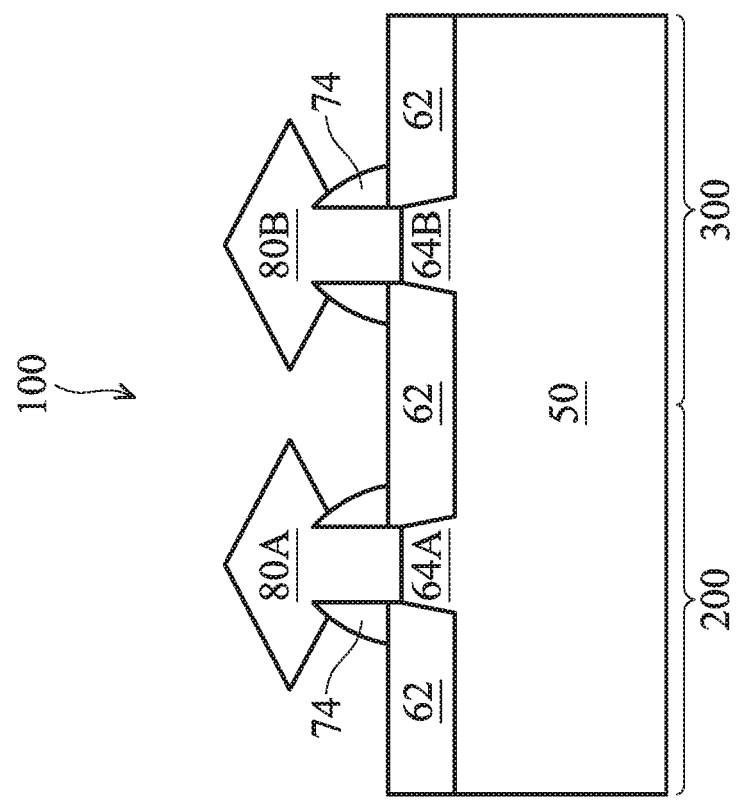

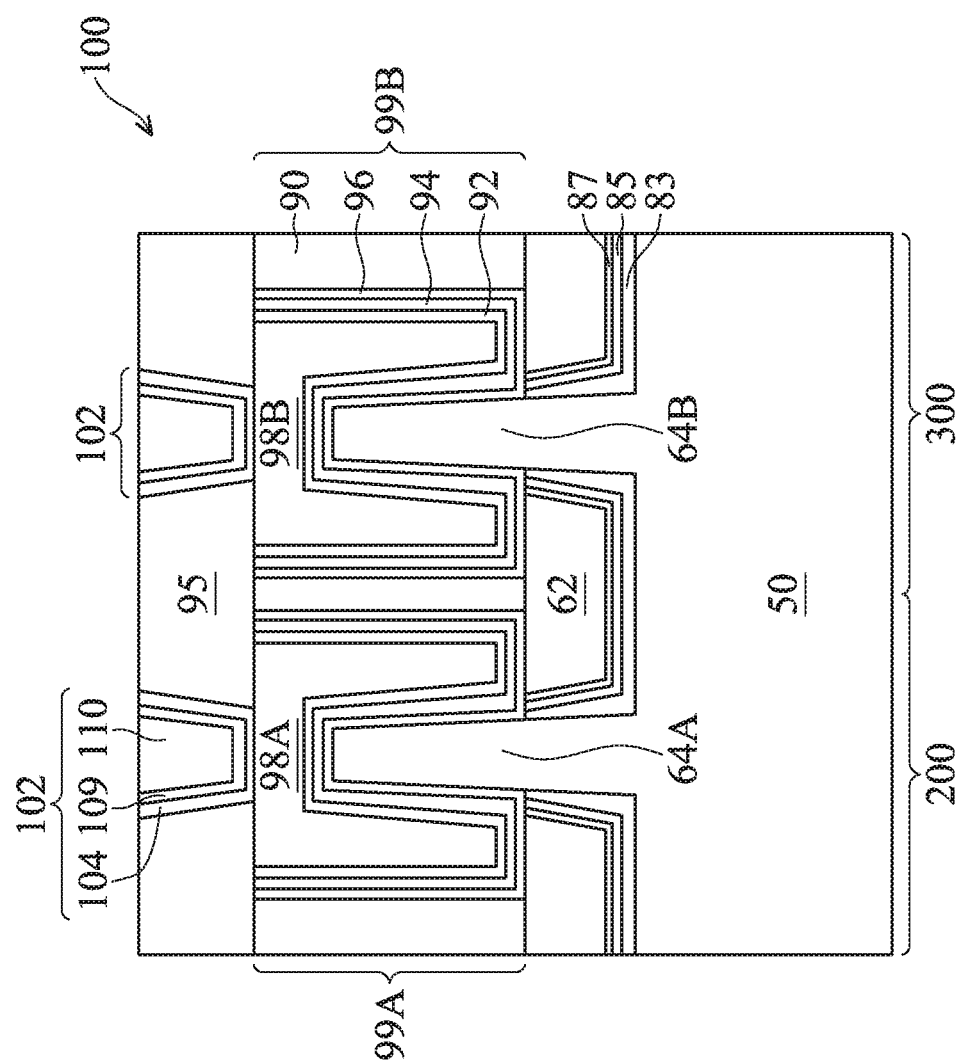

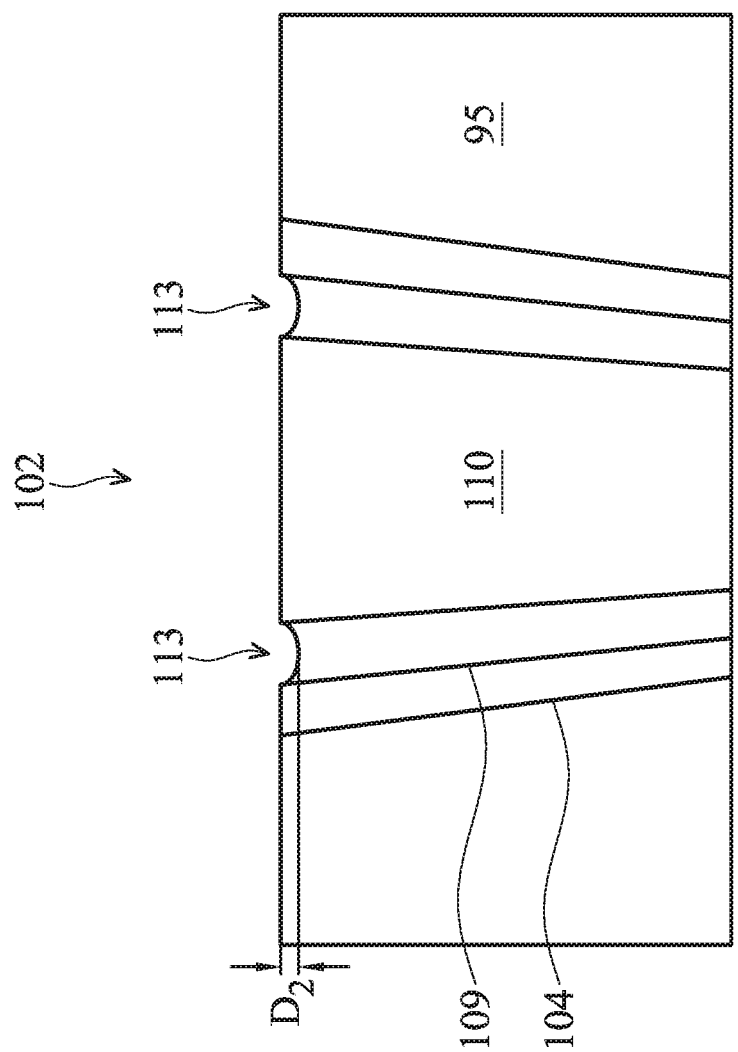

SEMICONDUCTOR DEVICE AND METHOD

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that includes a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-8, 9A-C, and 10-17 illustrate cross-sectional views of a FinFET device at various stages of fabrication, in accordance with some embodiments.

FIGS. 19 and 20A-20B illustrate cross-sectional views of a FinFET device at various stages of fabrication, in accordance with some embodiments.

FIG. 21 illustrates a cross-sectional view of a contact plug of a FinFET device at a stage of fabrication, in accordance with some embodiments.

DETAILED DESCRIPTION

Figure 1:
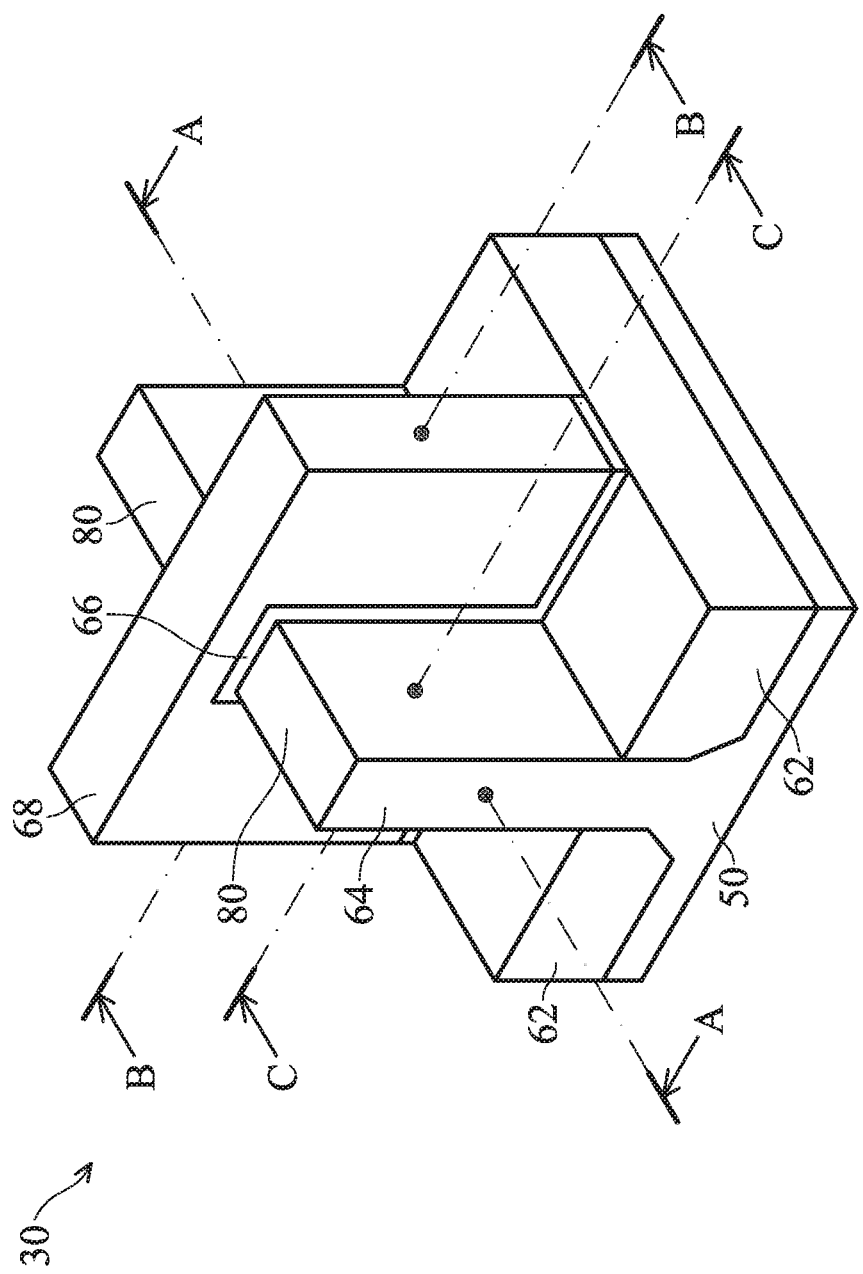
FIG. 1 illustrates a perspective view of a Fin Field-Effect Transistor (FinFET), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, contact plugs of a FinFET device and a method of forming the same. Various embodiments discussed herein allow for reducing the amount of impurities present in a seed layer of a contact plug. By reducing the amount of impurities in this manner, the resistance of the contact plugs may be reduced, process uniformity may be improved, and the performance of the FinFET device may thus be improved. Various embodiments presented herein are discussed in the context of FinFETs formed using a gate-last process. In other embodiments, a gate-first process may be used. The fins of a FinFET device may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers may be formed alongside the patterned sacrificial layer using a self-aligned process. The sacrificial layer is then removed, and the remaining spacers, or mandrels, may then be used to pattern the fins. Some embodiments contemplate aspects used in planar devices, such as planar FETs. Some embodiments may be used for metallization layers, source/drain contacts, gate contacts, other conductive features, or other types of devices. Some embodiments may also be used in semiconductor devices other than FETs.

FIG. 1 illustrates an example of a FinFET 30 in a perspective view. The FinFET 30 includes a substrate 50 having a fin 64. The fin 64 protrudes above neighboring isolation regions 62 disposed on opposing sides of the fin 64. A gate dielectric 66 is along sidewalls and over a top surface of the fin 64, and a gate electrode 68 is over the gate dielectric 66. Source/drain regions 80 are in the fin on opposite sides of the gate dielectric 66 and gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

FIGS. 2-8, 9A-C, 10-17, 19, and 20A-B are cross-sectional views of a FinFET device 100 at various stages of fabrication in accordance with some embodiments. The FinFET device 100 is similar to the FinFET 30 in FIG. 1, except for multiple fins. FIGS. 2-8, 9A, 10-17, 19, and 20A illustrate cross-sectional views of the FinFET device 100 along cross-section A-A. FIGS. 9B-C illustrate cross-section views of the FinFET device 100 along cross-section C-C. FIG. 20B illustrates a cross-sectional view of the FinFET device 100 along cross-section B-B.

Figure 2:
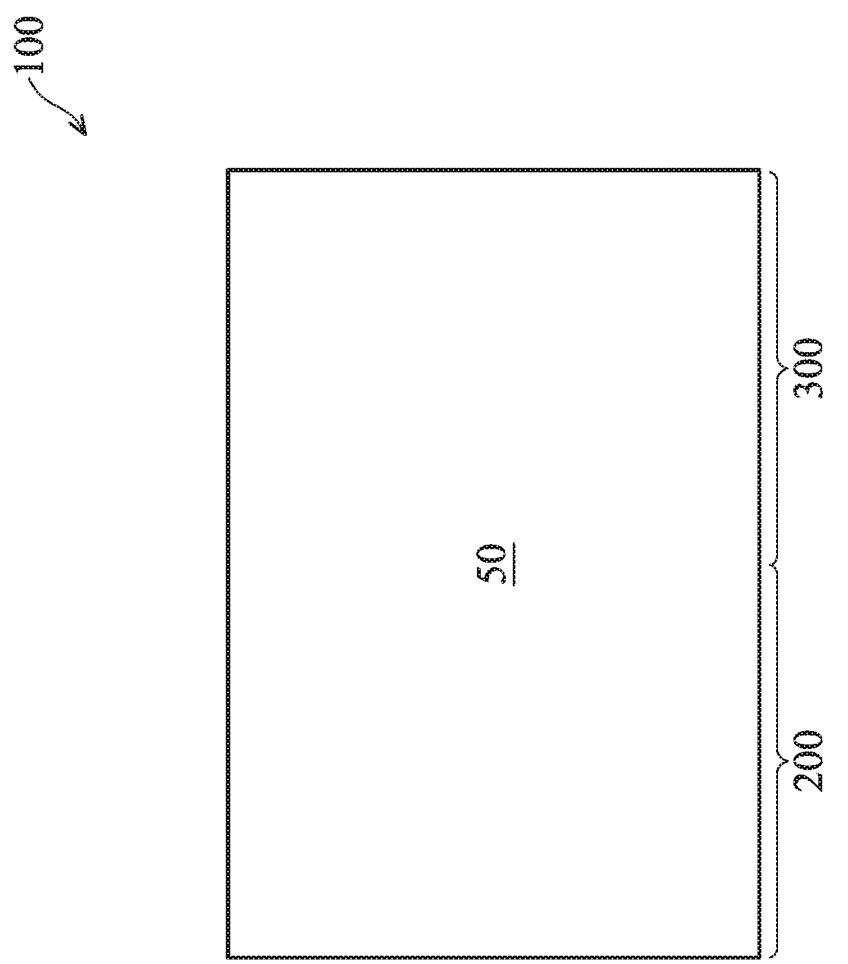

FIG. 2 illustrates a cross-sectional view of a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon, germanium, a compound semiconductor such as silicon carbide, gallium arsenic, gallium phosphide, indium phosphide, indium arsenide, indium antimonide, or the like, an alloy semiconductor such as SiGe, GaAsP, AlInAs, AlGaAs, GaInAs, GaInP, GaInAsP, or the like, another kind of semiconductor material, or combinations thereof.

As illustrated in FIG. 2, the substrate includes a first portion in region 200, and a second portion in region 300. In some embodiments, a first portion of the substrate 50 in region 200 may be used to form P-type devices such as P-type metal-oxide-semiconductor field-effect transistors (MOSFETs), and a second portion of the substrate 50 in region 300 may be used to form N-type devices such as N-type MOSFETs. Therefore, the region 200 may be referred to as a PMOS region, and the region 300 may be referred to as an NMOS region. In other embodiments, P-type devices or N-type devices are formed in both the region 200 and the region 300. In some embodiments, the region 200 may be physically separated from the region 300. Region 200 may be separated from the region 300 by any number of features.

Figure 3:
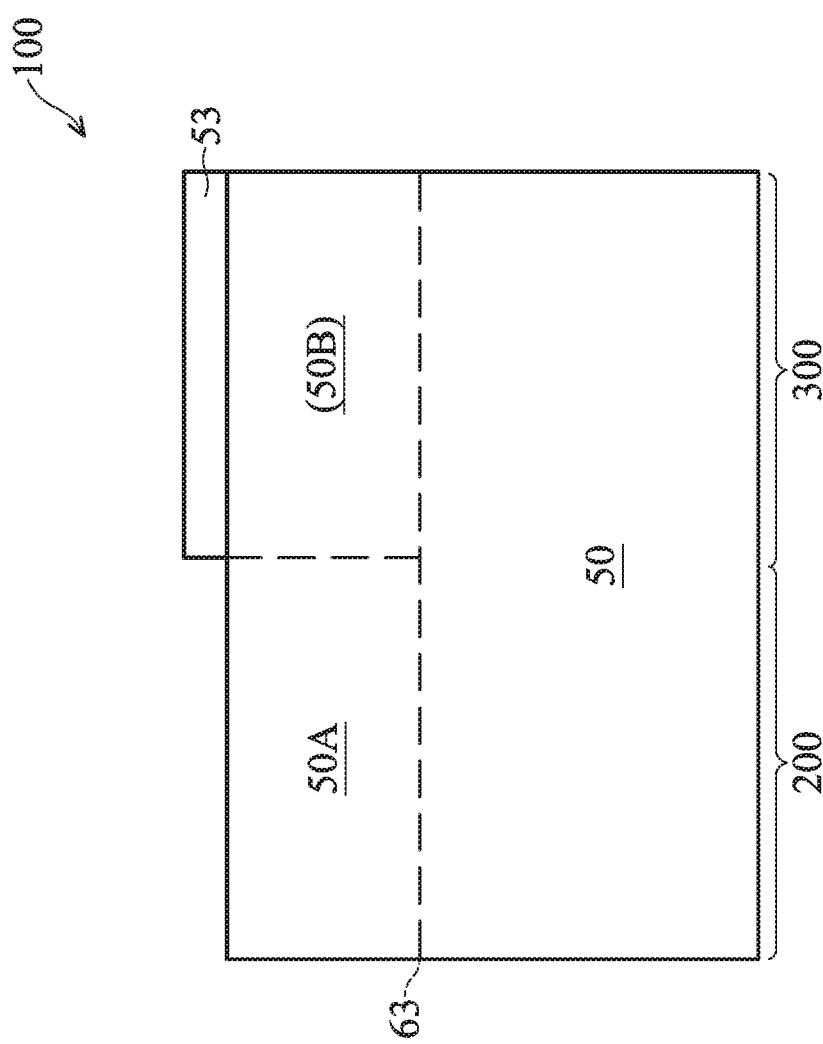

Next, referring to FIG. 3, a portion of the substrate 50 in the region 200 may be replaced with a semiconductor material 50A in some embodiments. The semiconductor material 50A may, for example, be an epitaxial semiconductor material that is suitable for forming a corresponding type of device (e.g., P-type device) in the region 200. For example, the semiconductor material 50A may include epitaxially grown silicon germanium, though other semiconductor materials may be used. To form the semiconductor material 50A, a mask layer 53, which may be a photosensitive layer such as photoresist, is formed over the substrate 50 using chemical vapor deposition (CVD), physical vapor deposition (PVD), spin coating, or other suitable deposition method. The mask layer 53 is then patterned using photolithographic and patterning techniques. The patterned mask layer 53 covers the region 300 but exposes the region 200, as illustrated in FIG. 3. An exposed portion of the substrate 500 in the region 200 is then removed by a suitable etching process, such as reactive ion etch (RIE), neutral beam etch (NBE), the like, or a combination thereof, to form a recess (not shown) in the region 200.

Next, an epitaxy is performed to grow the semiconductor material 50A in the recesses in the region 200. The epitaxially grown semiconductor material 50A may be in situ doped during growth, which may obviate the need for prior and subsequent implantations, although in situ and implantation doping may be used together. After the epitaxy, the mask layer 53 may be removed by a suitable removal process, such as etching or plasma ashing. A planarization process, such as chemical mechanical polish (CMP), may then be performed to level the top surface of the semiconductor material 50A with the top surface of the substrate 50. FIG. 3 also shows an interface 63 between the semiconductor material 50A and the substrate 50, which may or may not be a straight line as illustrated in FIG. 3.

In some embodiments, another patterned mask layer (not shown) may be formed to cover the region 200 while exposing the region 300, and an exposed portion of substrate 50 in the region 300 may be removed and replaced with an epitaxial grown semiconductor material 50B, which may be formed in the portion labeled "(50B)" in FIG. 3. The semiconductor material 50B may include an epitaxial semiconductor material that is suitable for forming a corresponding type of device (e.g., N-type device) in the region 300. For example, the semiconductor material 50B may be or may include epitaxially grown silicon carbide, though other semiconductor materials may be used.

In some embodiments, the FinFET device 100 to be formed is a logic device, the PMOS region (e.g., region 200) has its top portion replaced by the semiconductor material 50A (e.g., silicon germanium), and the NMOS region (e.g., region 300) does not have its top portion replaced by the semiconductor material 50B, thus the NMOS region (e.g., region 300) has a same material (e.g., silicon) as the substrate 50. In another embodiment, the FinFET device 100 to be formed is a high power device, in which case the PMOS region (e.g., region 200) and the NMOS region (e.g., region 300) have their top portions replaced by a same semiconductor material silicon carbide (e.g., 50A and 50B are silicon carbide).

In other embodiments, the semiconductor material 50B (e.g., an epitaxial semiconductor material) replaces a portion of the substrate 50 in the region 300, and a portion of the substrate 50 in the region 200 may optionally be replaced by the semiconductor material 50A (e.g., an epitaxial semiconductor material). In yet other embodiments, the above described epitaxial semiconductor materials (e.g., 50A and 50B) are not formed, thus the processing illustrated in FIG. 3 may be omitted. The discussion below use an embodiment configuration for the substrate 50 where the semiconductor material 50A is formed in the first region 200 and the semiconductor material 50B is not formed in the region 300, with the understanding that the example processing steps illustrated herein may also be applied to other substrate configurations described above. In the discussion hereinafter, substrate 50 is used to collectively refer to substrate 50 and the semiconductor materials 50A/50B, if formed.

The semiconductor materials 50A and 50B may have respective lattice constants greater than, substantially equal to, or smaller than, the lattice constant of substrate 50. The lattice constants of the semiconductor materials 50A and 50B may be determined by the materials selected by the conductivity types (e.g., N-type or P-type) of the resulting FinFETs. Further, it may be advantageous to epitaxially grow a material in an NMOS region different from the material in a PMOS region. In various embodiments, the semiconductor materials 50A and 50B may include silicon germanium, silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 4:
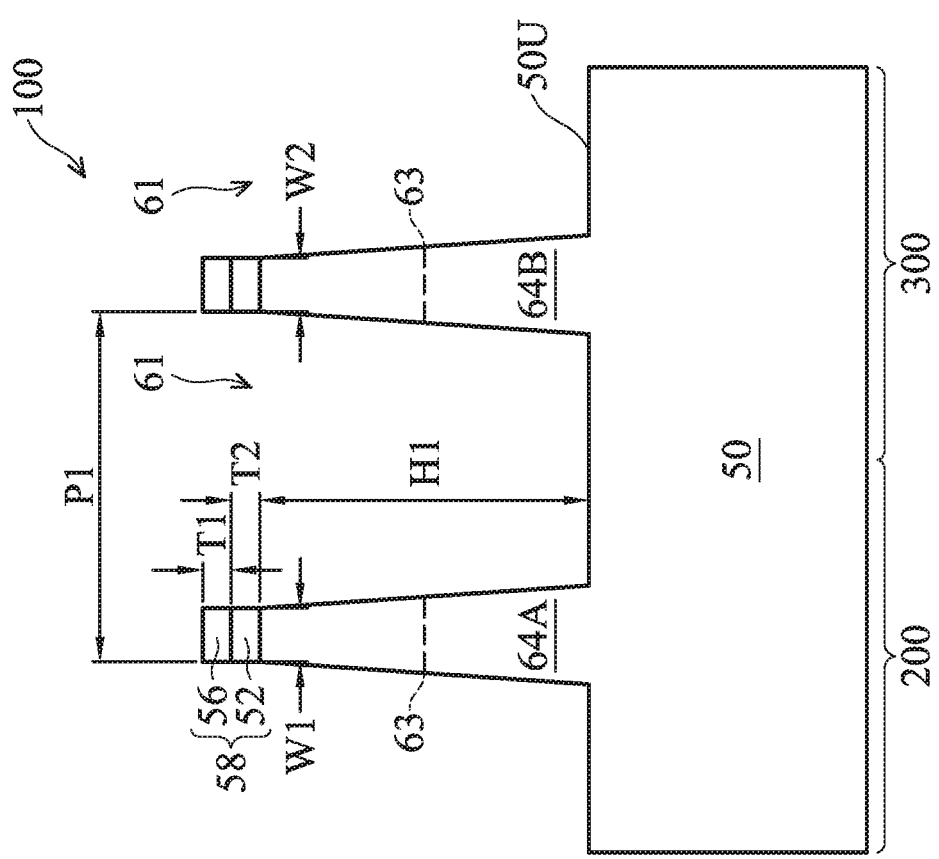

Next, referring to FIG. 4, the substrate 50 is patterned using photolithography and etching techniques. For example, a mask layer, such as a pad oxide layer (not shown), and an overlying pad nitride layer (not shown), may be formed over the substrate 50. In some cases, the pad oxide layer may be a thin film including silicon oxide that is formed, for example, using a thermal oxidation process. The pad oxide layer may act as an adhesion layer between the substrate 50 and the overlying pad nitride layer. In some embodiments, the pad nitride layer is formed of silicon nitride, silicon oxynitride, silicon carbide, silicon carbonitride, the like, or a combination thereof. The pad nitride layer may be formed using low-pressure chemical vapor deposition (LPCVD) process, a plasma enhanced chemical vapor deposition (PECVD) process, or using another process.

The mask layer may be patterned using photolithography techniques. Generally, photolithography techniques use a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer and pad nitride to form a patterned mask 58. As illustrated in FIG. 4, the patterned mask 58 includes patterned pad oxide 52 and patterned pad nitride 56.

The patterned mask 58 is subsequently used to pattern exposed portions of the substrate 50 to form trenches 61, thereby defining semiconductor fins 64 (also referred to as fins) between adjacent trenches, as illustrated in FIG. 4. Two fins 64A and 64B are shown in FIG. 4, but a single fin or three or more fins may be formed in other embodiments. In some embodiments, the semiconductor fins 64 are formed by etching trenches in the substrate 50 using, for example, reactive ion etch (RIE), neutral beam etch (NBE), the like, or a combination thereof. The etch may be anisotropic. In some embodiments, the trenches may be strips (in a plan view) that are parallel to each other and may be closely spaced with respect to each other. In some embodiments, the trenches may be continuous and surround the semiconductor fins 64.

The fins 64 may be patterned by any suitable method. For example, the fins may 64 be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

As illustrated in FIG. 4, a fin 64A is formed in the first region 200, and a fin 64B is formed in the second region 300. Because a top portion of the substrate 50 in the region 200 has been replaced by a semiconductor material 50A, an upper portion of the fin 64A above the interface 63 is formed of the semiconductor material 50A, and a lower portion of the fin 64A below the interface 63 is formed of the material of the substrate 50. In an exemplary embodiment, the portion of fin 64A above the interface 63 is formed of silicon germanium, the portion of fin 64A below the interface 63 is formed of silicon, and the fin 64B is formed of silicon.

The example of FIG. 4 illustrates the case where bottoms of the trenches 61 extend below the interface 63. In other embodiments, the bottoms of the trenches 61 extend above or at the interface 63, in which case the fin 64A is formed entirely of the semiconductor material 50A, and the fin 64B is formed entirely of the material of the substrate 50. Although FIG. 4 illustrates one fin 64A in the region 200 and one fin 64B in the region 300, more than one fin may be formed in the region 200 or the region 300. These and other variations are fully intended to be included within the scope of the present disclosure. For simplicity, the interface 63 may not be illustrated in all subsequent figures.

In some embodiments, a thickness $T_1$ of the patterned pad nitride 56 may be between about 18.5 nm and about 21.5 nm, and a thickness $T_2$ of the patterned pad oxide 52 may be between about 1.5 nm and about 2.5 nm. A fin height $H_1$, measured between a top surface of the fin 64 and an upper surface 50U of the substrate 50 proximate the fin 64, may be between about 109.5 nm and about 117.5 nm. A fin width $W_1$ measured at the top surface of the fin 64A may be between about 8.8 nm and about 12.4 nm, and a fin width $W_2$ measured at the top surface of the fin 64B may be between about 8.9 nm and about 13.1 nm. A pitch $P_1$ between two adjacent fins 64A and 64B may be between about 24.5 nm to about 27.5 nm. These are examples, and the dimensions of the features indicated above may be different in other embodiments.

Figure 5:
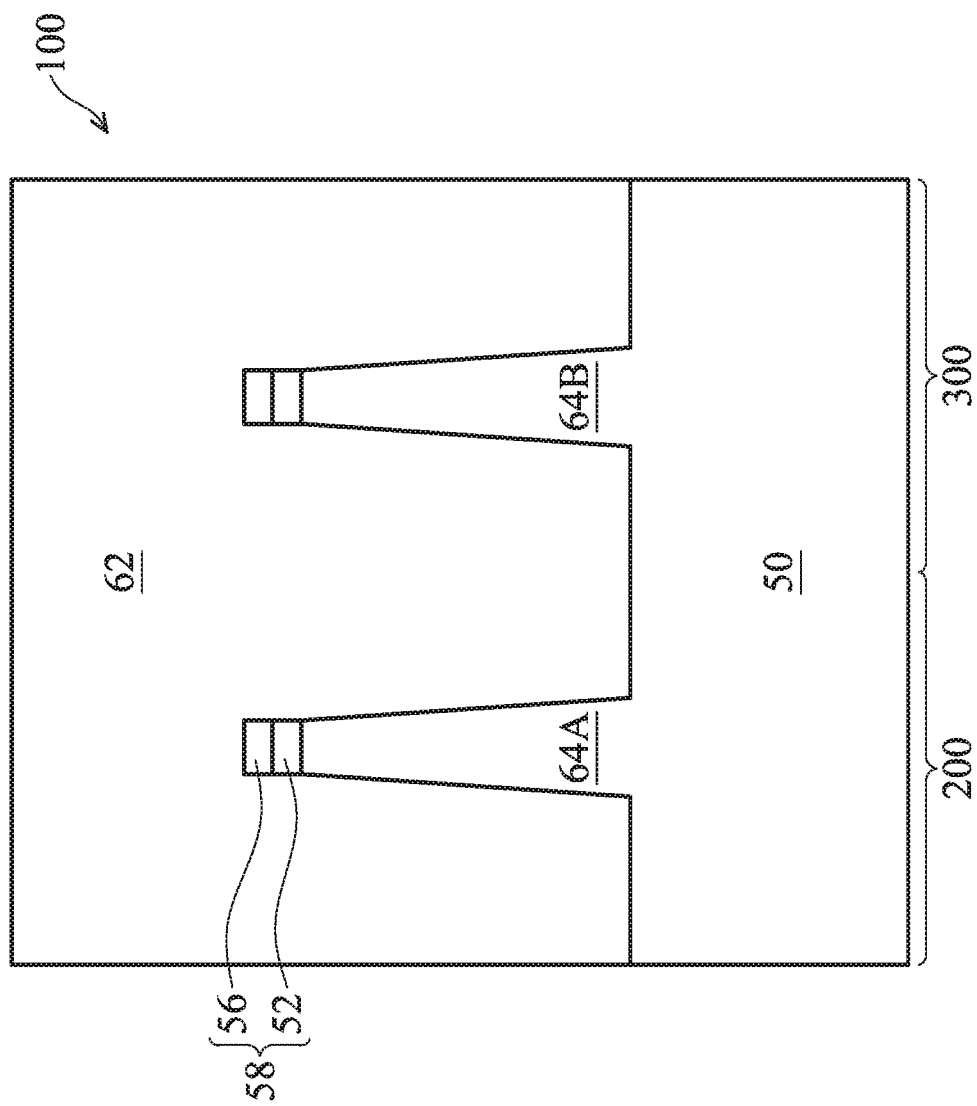

Next, as illustrated in FIG. 5, an insulation material 62 is formed to fill the trenches 61 (see FIG. 4). In some cases, an anneal process may be performed to cure the deposited insulation material 62. The insulation material 62 may be an oxide, such as silicon oxide, a nitride, the like, or a combination thereof, and may be formed by a high density plasma chemical vapor deposition (HDP-CVD), a flowable CVD (FCVD), the like, or a combination thereof. Other insulation materials and/or other formation processes may be used.

Figure 6:
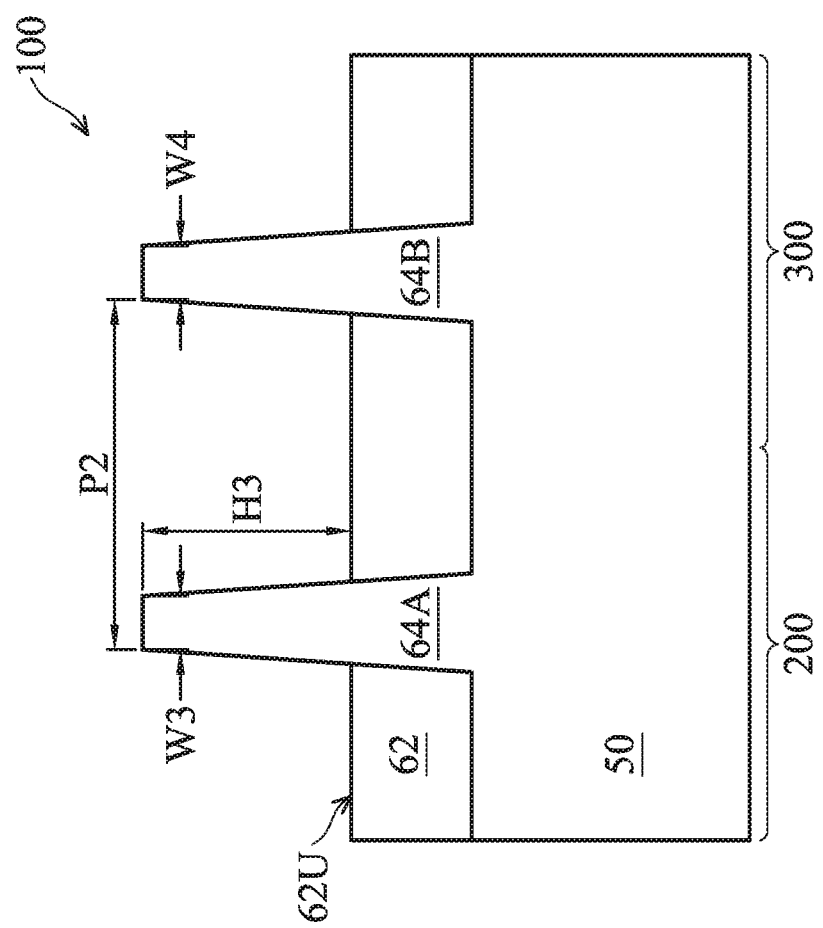

Next, in FIG. 6, the insulation material 62 is recessed such that upper portions of the fins 64 protrude above an upper surface 62U of the recessed insulation material 62. The recessing of the insulation material 62 may also remove the pad nitride 56 and the pad oxide 52, as shown in FIG. 6. The recessed insulation material 62 forms isolation regions 62, which may be shallow trench isolation (STI) regions in some embodiments. The insulation material 62 may be recessed using a dry etch, and the dry etch may use an etching gas such as ammonia, hydrogen fluoride, another etching gas, or a combination of etching gases. Other suitable etching processes may also be used to recess the insulation material 62.

The top surfaces 62U of the insulation material 62 may have a flat surface (as illustrated in FIG. 6), a convex surface, a concave or dished surface, or a combination thereof. The top surfaces 62U of the insulation material 62 may be formed as flat, convex, or concave by one or more appropriate etches. The insulation material 62 may be recessed using an acceptable etching process, such as one that is selective to the material of the insulation material 62. For example, a chemical oxide removal using a CERTAS® etch or an Applied Materials SICONI tool or dilute hydrofluoric (dHF) acid may be used.

As illustrated in FIG. 6, a fin height $H_3$, measured between the top surface of the fins 64 and the top surface 62U proximate the fins 64 may be between about 52.5 nm and about 55.5 nm. A fin width $W_3$ for the fin 64A may be between about 7.5 nm and about 11 nm, and a fin width $W_4$ for the fin 64B may be between about 7 nm and about 13.7 nm. A fin pitch $P_2$ between the fins 64A and the fin 64B, measured after the recessing of the insulation material 62, may be between about 24.5 nm and about 27.5 nm. In some embodiments, the fin pitch $P_2$ is the same as the fin pitch $P_1$ (shown in FIG. 4). These are example dimensions, and the features above may have other dimensions in other embodiments.

Figure 7:
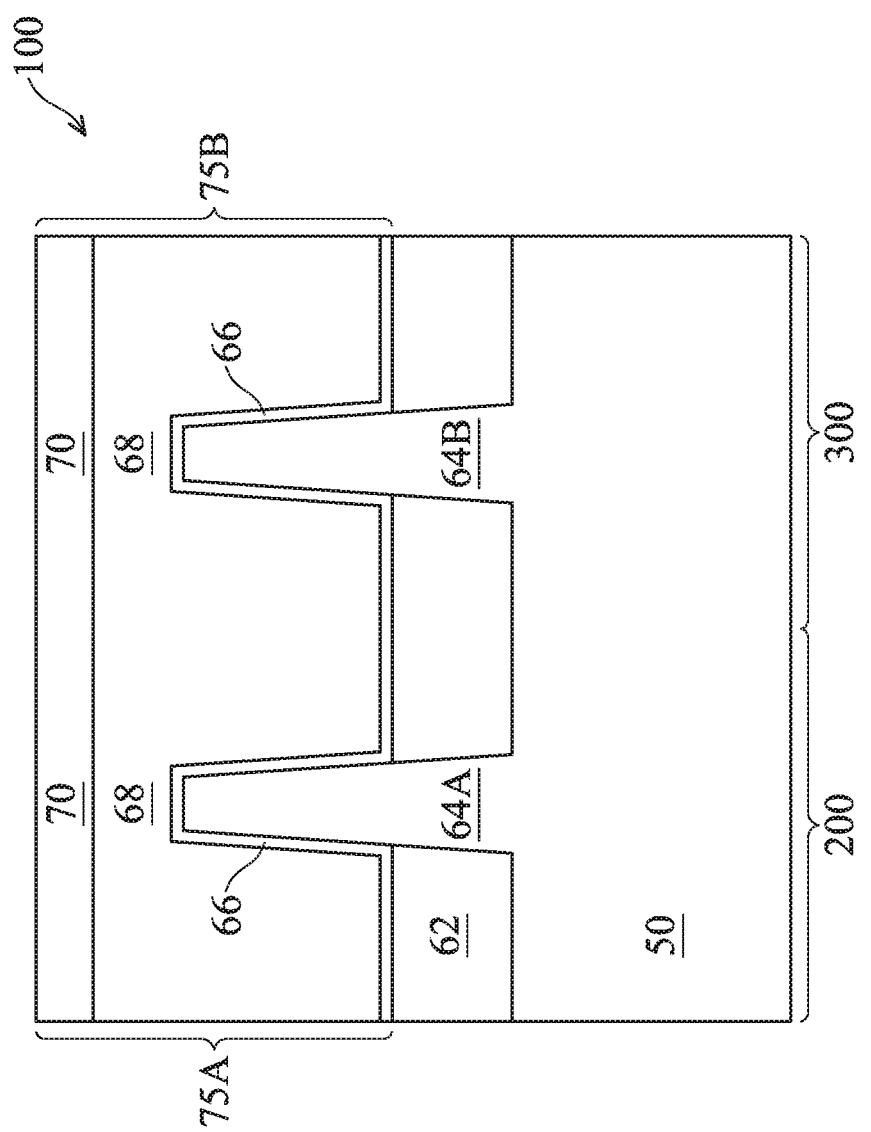

FIG. 7 illustrates the formation of dummy gate structures 75 over the semiconductor fins 64. In particular, dummy gate structure 75A is formed over semiconductor fin 64A, and dummy gate structure 75B is formed over semiconductor fin 64B. The example dummy gate structures 75 include a gate dielectric 66, a gate electrode 68, and a mask 70. To form the dummy gate structures 75, a gate dielectric material is first formed over the semiconductor fins 64 and the isolation regions 62. The gate dielectric material may be, for example, silicon oxide, silicon nitride, multilayers thereof, or the like, and may be deposited or thermally grown according to acceptable techniques. In some embodiments, the gate dielectric material may be a high-k dielectric material, and in these embodiments, the gate dielectric material may have a k value greater than about 7.0, and may include a metal oxide or a silicate of Hf, Al, Zr, La, Mg, Ba, Ti, Pb, multilayers thereof, and combinations thereof. The formation methods of gate dielectric material may include molecular-beam deposition (MBD), atomic layer deposition (ALD), plasma-enhanced CVD (PECVD), and the like.

A gate material is then formed over the gate dielectric material, and a mask layer is formed over the gate material. The gate material may be deposited over the gate dielectric material and then planarized, such as by a CMP process. The mask layer may then be deposited over the planarized gate material. In some embodiments, the gate material may be formed of polysilicon, although other materials may also be used. In some embodiments, the gate material may include a metal-containing material such as TiN, TaN, TaC, Co, Ru, Al, combinations thereof, or multi-layers thereof. In some embodiments, the mask layer may be a hardmask, and may be formed of silicon nitride, although other materials may also be used.

After gate dielectric material, the gate material, and the mask layer are formed, the mask layer may be patterned using acceptable photolithography and etching techniques to form mask 70. The pattern of the mask 70 then may be transferred to the gate material and the dielectric material by an acceptable etching technique to form gate electrode 68 and gate dielectric 66, respectively. The gate electrode 68 and the gate dielectric 66 cover respective channel regions of the semiconductor fins 64. The gate electrode 68 may also have a lengthwise direction substantially perpendicular to the lengthwise direction of respective semiconductor fins 64.

FIGS. 8, 9A-C, 10-17, 19, and 20A-B illustrate various cross-section views of further processing of the FinFET device 100. In some embodiments, the processing steps as illustrated are performed similarly for both the PMOS region 200 and the NMOS region 300, with some materials (e.g., dopants for source/drain regions, work function layers of metal gates, or other materials) adjusted to suit the type of devices (e.g., P-type devices or N-type devices) formed in the respective regions. For simplicity, a single representative cross-sectional view along cross-section A-A of a single fin 64 is shown in each of FIGS. 8, 9A, 10-17, 19, and 20A.

Figure 8:
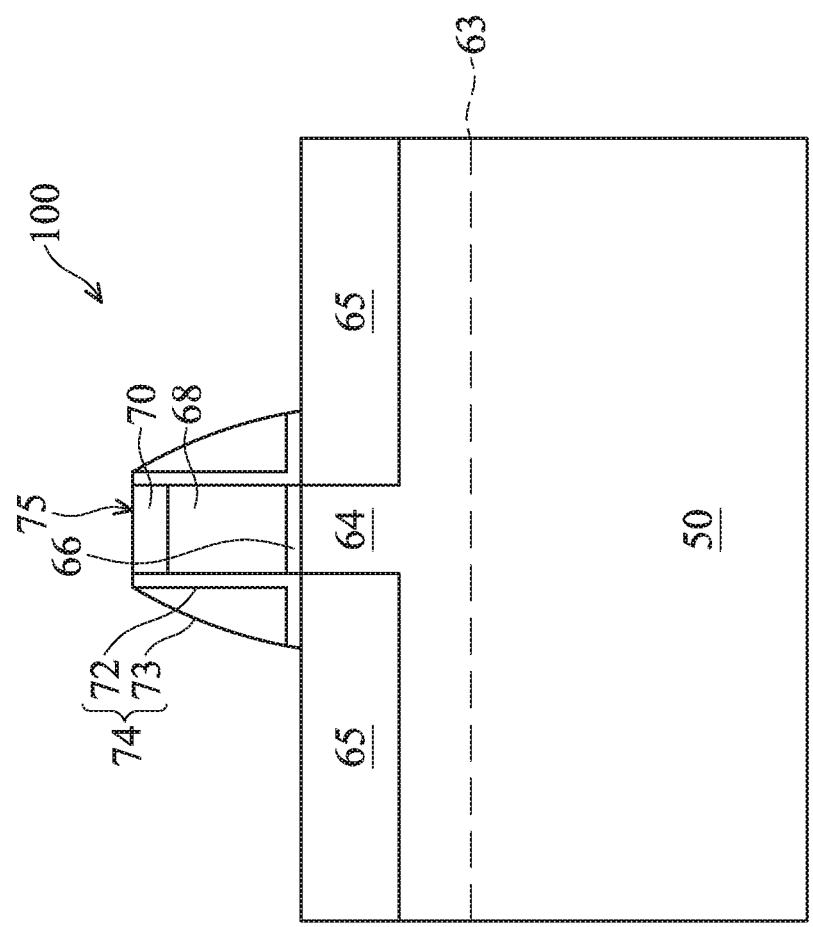
Figure 9A:
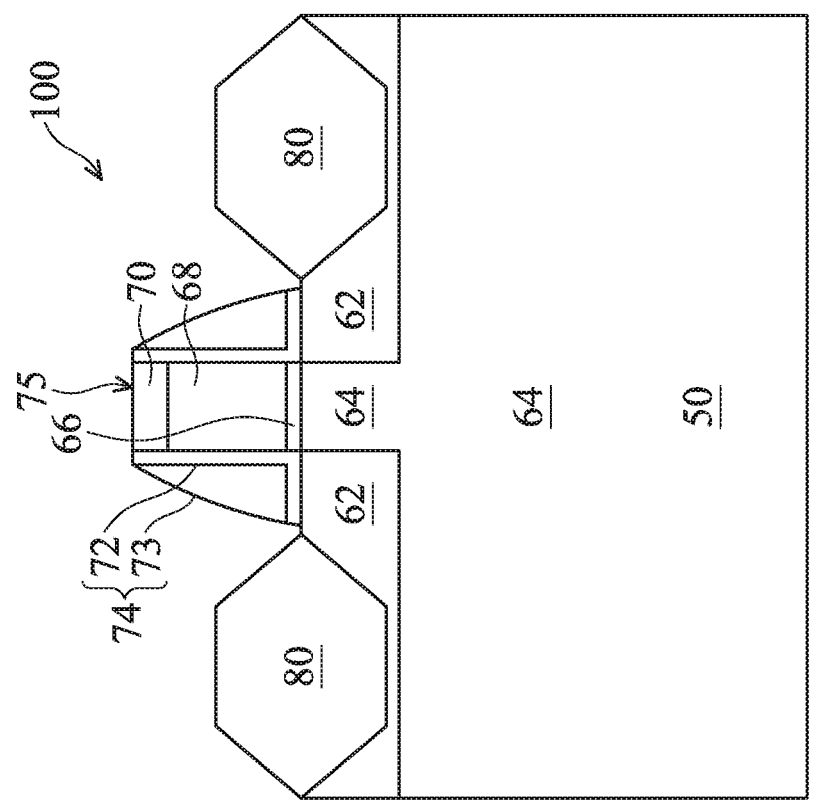
Figure 9B:
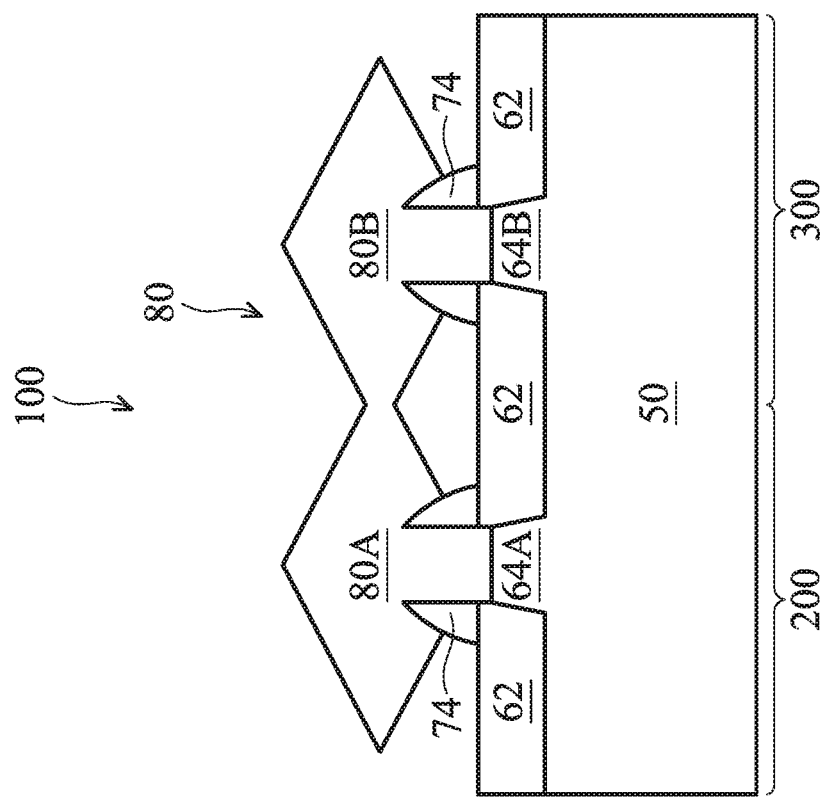

As illustrated in FIG. 8, lightly doped drain (LDD) regions 65 are formed in the fin 64, and gate spacers 74 are formed on the gate structure 75. The LDD regions 65 may be formed, for example, by a plasma doping process. The plasma doping process may implant N-type impurities (for N-type devices) or P-type impurities (for P-type devices) in the fins 64 to form the LDD regions 65. For example, a patterned mask layer may be formed to shield the PMOS region 200 while N-type impurities are implanted into the LDD regions 65 of the NMOS region 300. Similarly, another patterned mask layer may be formed to shield the NMOS region 300 while P-type impurities are implanted into the LDD regions 65 of the PMOS region 200. FIG. 8 also illustrates the interface 63 between the semiconductor material 50A and the substrate 50. For simplicity, the interface 63 may not be illustrated in all figures.

In some embodiments, the LDD regions 65 abut the channel region of the FinFET device 100. Portions of the LDD regions 65 may extend under gate electrode 68 and into the channel region of the FinFET device 100. FIG. 8 illustrates an example of the LDD regions 65, but other configurations, shapes, and formation methods of the LDD regions 65 are also possible and are fully intended to be included within the scope of the present disclosure. For example, LDD regions 65 may be formed after first gate spacers 72 are formed in other embodiments.

After the LDD regions 65 are formed, gate spacers 74 are formed on the gate structure 75. In some embodiments, the gate spacers 74 may include a first gate spacer 72 and a second gate spacer 73. In the example of FIG. 8, the first gate spacer 72 is formed on opposing sidewalls of the gate electrode 68 and on opposing sidewalls of the gate dielectric 66. In some cases, the first gate spacer 72 may also extend over the upper surface of the semiconductor fins 64 (i.e., over the LDD regions 65 formed within the fins 64) or over the upper surface of the isolation regions 62. The second gate spacer 73 may be formed over the first gate spacer 72, as illustrated in FIG. 8. The first gate spacer 72 may be formed of a nitride, such as silicon nitride, silicon oxynitride, silicon carbide, silicon carbonitride, another material, or a combination thereof. The first gate spacer may be formed using a thermal oxidation process, CVD, or another suitable deposition process. The second gate spacer 73 may be formed of silicon nitride, silicon carbonitride, another material, or a combination thereof, and may be formed using a suitable deposition method.

In some embodiments, the gate spacer 74 is formed by first conformally depositing a first gate spacer material over the gate structure 75, then conformally depositing a second gate spacer material over the deposited first gate spacer material. Next, an anisotropic etch process, such as a dry etch process, may be performed to remove portions of the first gate spacer material and the second gate spacer material disposed over the upper surface of the gate structure 75 while keeping portions of the first gate spacer material and the second gate spacer material remaining along sidewalls of the gate structure 75. The anisotropic etch process may also remove other portions of the first gate spacer material or second gate spacer material such as those disposed over the upper surfaces of fin 64 or isolation regions 62. The remaining portions of the first gate spacer material forms the first gate spacer 72 and the remaining portions the second gate spacer material forms the second gate spacer 73. The gate spacer 74 as illustrated in FIG. 8 is an example, and other shapes of gate spacer layers, additional gate spacer layers, or other methods of forming a gate spacer are also possible.

Next, as illustrated in FIG. 9A, source/drain regions 80 are formed. The source/drain regions 80 are formed by etching the LDD regions 65 within the fins 64 to form recesses, and then epitaxially growing material in the recess. The epitaxial material of source/drain regions 80 may be grown using suitable methods such as metal-organic CVD (MOCVD), molecular beam epitaxy (MBE), liquid phase epitaxy (LPE), vapor phase epitaxy (VPE), selective epitaxial growth (SEG), another process, or a combination thereof. FIGS. 9B and 9C illustrate two embodiments of the structure shown in FIG. 9A along cross-section C-C.

As illustrated in FIG. 9A, the source/drain regions 80 may protrude above upper surfaces of the fins 64. In some cases, the source/drain regions 80 may have facets or may have irregular shapes. In some embodiments, source/drain regions of adjacent fins may merge to form a continuous epitaxial source/drain region, such as shown in FIG. 9B, in which epitaxial source/drain regions 80A and 80B have merged to form a continuous epitaxial source/drain region 80. In some embodiments, more than two adjacent epitaxial source/drain regions may be merged to form a continuous epitaxial source/drain region. In some embodiments, the source/drain regions of adjacent fins do not merge together and remain separate source/drain regions, such as shown in FIG. 9C, in which epitaxial source/drain regions 80A and 80B remain separated. In some embodiments in which the resulting FinFET is an n-type FinFET, source/drain regions 80 may include silicon carbide, silicon phosphorous, phosphorous-doped silicon carbon (SiCP), or the like. In some embodiments in which the resulting FinFET is a p-type FinFET, source/drain regions 80 may include silicon germanium and may include a p-type impurity such as boron or indium. In some embodiments, silicon germanium in the source/drain regions 80 is formed to have a higher atomic percentage of germanium than silicon germanium in the channel region of the FinFET device, such that compressive strain is induced in the channel region of the FinFET device.

In some embodiments, epitaxial source/drain regions 80 may be implanted with dopants. The implanting process may include forming and patterning masks such as a photoresist to cover the regions of the FinFET that are to be protected from the implanting process. In some embodiments, portions of the source/drain regions 80 may have a dopant concentration range between about $1E19$ cm$^{-3}$ and about $1E21$ cm$^{-3}$. In some embodiments, the epitaxial source/drain regions may be in situ doped during epitaxial growth.

Figure 10:
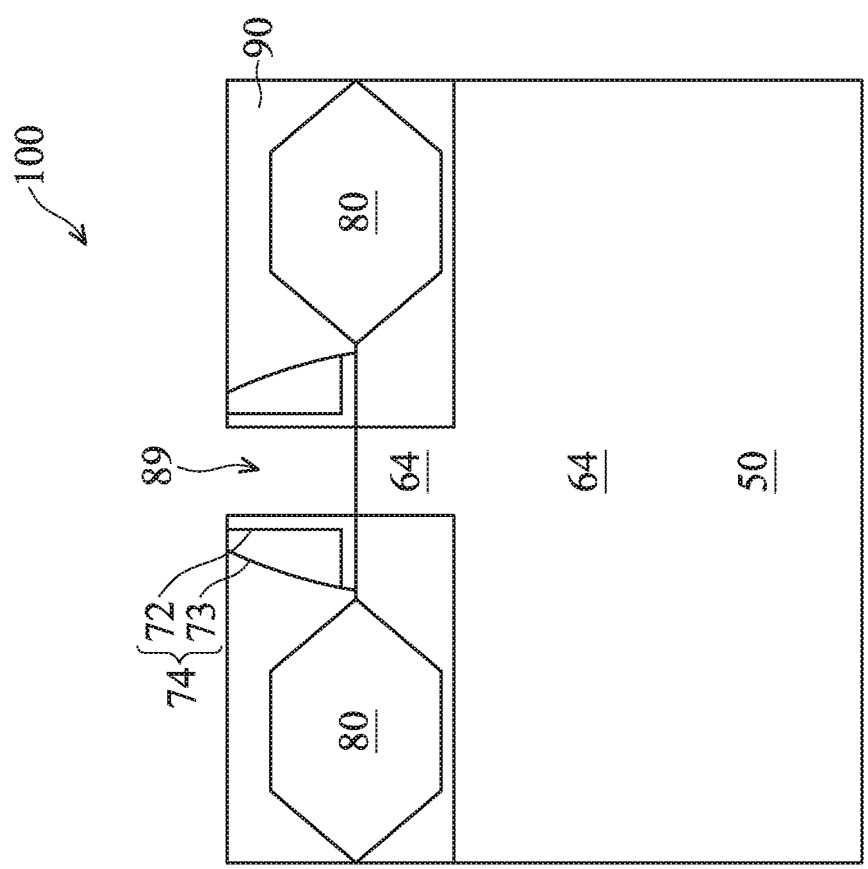
Figure 11:
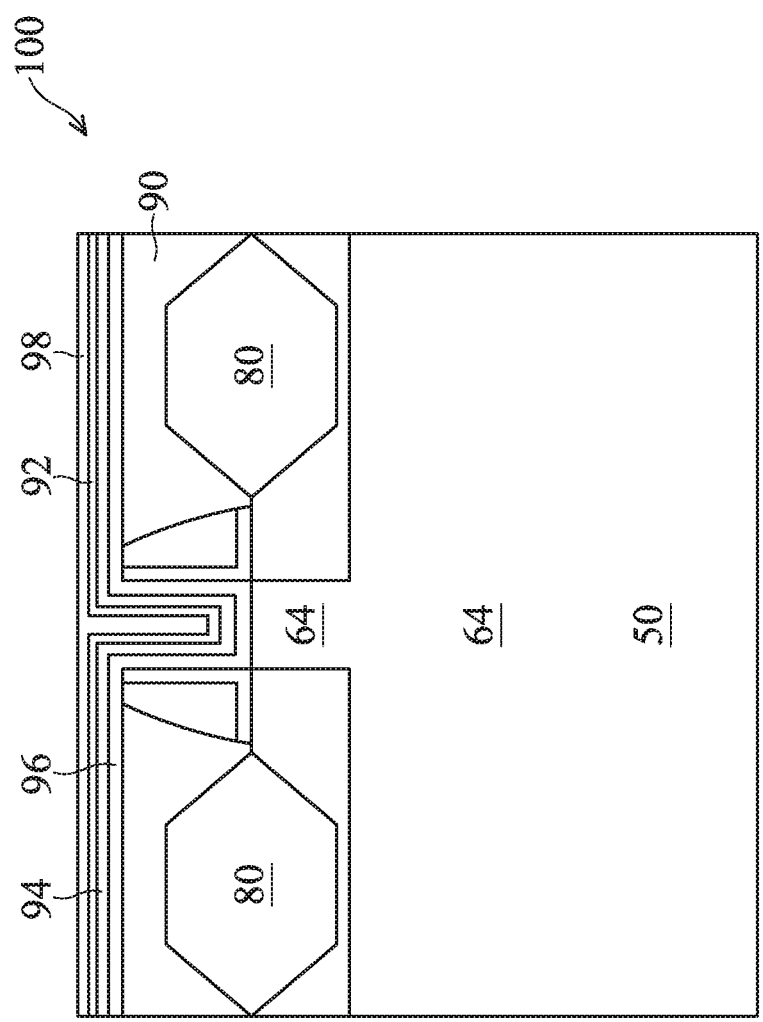
Figure 12:
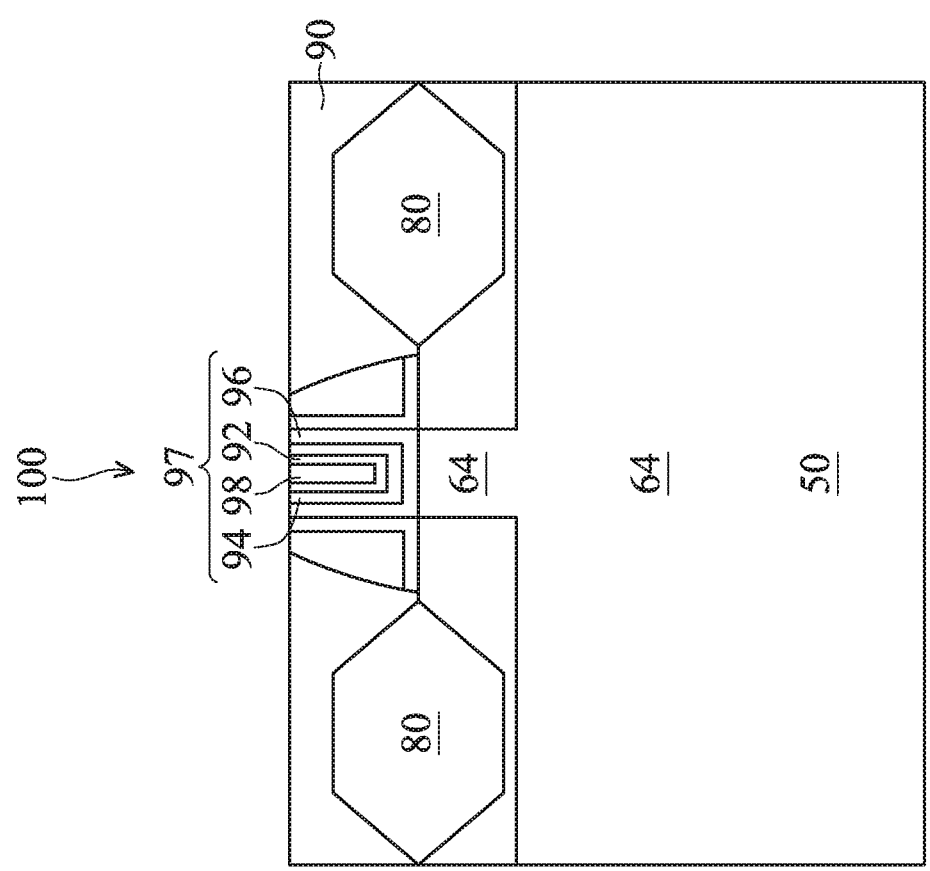

Next, as illustrated in FIGS. 10-12, a first interlayer dielectric (ILD) 90 is formed over the structure illustrated in FIG. 9A, and a gate-last process (sometimes referred to as a replacement gate process) is performed. In a gate-last process, the gate electrode 68 and the gate dielectric 66 are dummy structures which are removed and replaced with an active gate and active gate dielectric.

Referring to FIG. 10, the first ILD 90 may be formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD, in some embodiments. A planarization process, such as a CMP process, may be performed to remove the mask 70 and to planarize the top surface of the first ILD 90. After the CMP process, the top surface of the gate electrode 68 may be exposed.

In accordance with some embodiments, the gate electrode 68 and the gate dielectric 66 directly under the gate electrode 68 are removed in one or more etching steps, so that recesses 89 are formed between respective spacers 74. Each recess 89 exposes a channel region of a respective fin 64. Each channel region is disposed between neighboring pairs of epitaxial source/drain regions 80. In some cases, the gate dielectric 66 may be used as an etch stop layer when the gate electrode 68 is etched. The gate dielectric 66 may then be removed after the removal of the gate electrode 68.

Next, in FIG. 11, a gate dielectric layer 96, a barrier layer 94, a seed layer 92, and a gate fill 98 are deposited for forming a replacement active gate. The gate dielectric layer 96 is deposited conformally in the recess 89, such as on the top surfaces and the sidewalls of the fins 64, on sidewalls of the first gate spacers 72, and on a top surface of the first ILD 90. In some embodiments, the gate dielectric layer 96 includes silicon oxide, silicon nitride, or multiple layers thereof. In other embodiments, the gate dielectric layer 96 includes a high-k dielectric material, and in these embodiments, the gate dielectric layers 96 may have a k value greater than about 7.0. The gate dielectric layer may include a metal oxide or a silicate of Hf, Al, Zr, La, Mg, Ba, Ti, Pb, other materials, or combinations thereof. The formation methods of gate dielectric layer 96 may include MBD, ALD, PECVD, or other processes.

Next, a barrier layer 94 may be formed conformally over the gate dielectric layer 96. The barrier layer 94 may include an electrically conductive material such as titanium nitride, although other materials may be used such as tantalum nitride, titanium, tantalum, other materials, or combinations thereof. The barrier layer 94 may be formed using a CVD process, such as plasma-enhanced CVD (PECVD). However, other processes, such as sputtering, metal organic chemical vapor deposition (MOCVD), atomic layer deposition (ALD), or other processes, may also be used.

Although not illustrated in FIG. 11, one or more work function layers may be formed over the barrier layer 94. For example, P-type work function layer(s) may be formed in the region 200, and N-type work function layer(s) may be formed in the region 300. Exemplary P-type work function metals that may be included in the gate structure include TiN, TaN, Ru, Mo, Al, WN, $ZrSi_2$, $MoSi_2$, $TaSi_2$, $NiSi_2$, WN, other suitable P-type work function materials, or combinations thereof. Exemplary N-type work function metals that may be included in the gate structure include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed in the respective region. The work function layer(s) may be deposited by CVD, physical vapor deposition (PVD), or another suitable process. In some cases, the barrier layer 94 may reduce diffusion of work function materials or other materials into the gate dielectric layer 96.

Next, a seed layer 92 is formed over the barrier layer 94 (or over any work function layers, if present). The seed layer 92 may include copper, titanium, tantalum, titanium nitride, tantalum nitride, another material, or a combination thereof, and may be deposited by atomic layer deposition (ALD), sputtering, physical vapor deposition (PVD), or another process. In some embodiments, the seed layer is a metal layer, which may be a single layer or may be a composite layer including multiple sub-layers formed of different materials. In some embodiments, the seed layer includes a titanium layer and a copper layer disposed over the titanium layer.

Next, a gate fill 98 is deposited over the seed layer 92, which fills the remaining portions of the recess 89. The gate fill 98 may be made of a metal-containing material such as TiN, TaN, TaC, Co, Ru, Al, other materials, combinations thereof, or multi-layers thereof. The gate fill 98 may be formed by electroplating, electroless plating, or another suitable process.

Next, as illustrated in FIG. 12, after the formation of the gate fill 98, a planarization process, such as a CMP, may be performed to remove the excess portions over the top surface of first ILD 90 of the gate dielectric layer 96, the barrier layer 94, any work function layers, the seed layer 92, and the material of the gate fill 98. The resulting remaining portions of material of the gate fill 98, the seed layer 92, any work function layers, the barrier layer 94, and the gate dielectric layer 96 thus form a replacement gate 97 of the resulting FinFET device 100.

Figure 13:
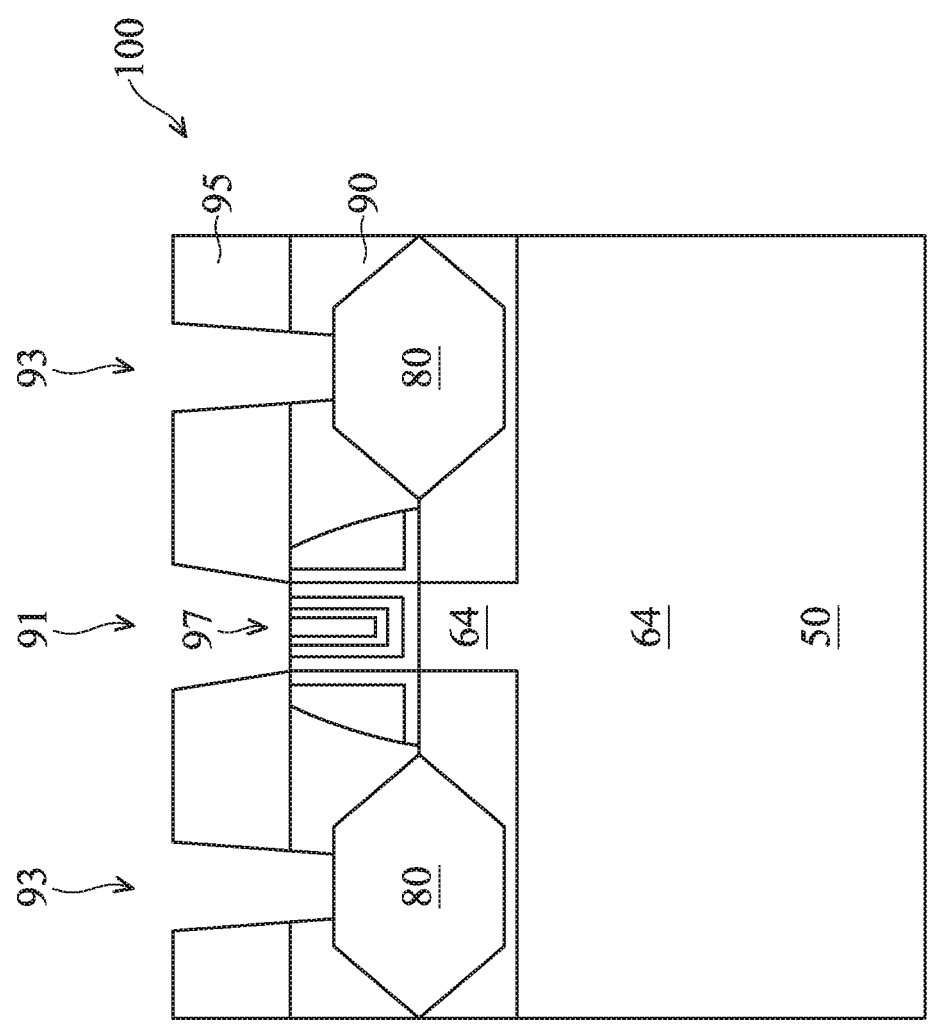

Next, in FIG. 13, a second ILD 95 is deposited over the first ILD 90. In an embodiment, the second ILD 95 is a flowable film formed by a flowable CVD method. In some embodiments, the second ILD 95 is formed of a dielectric material such as PSG, BSG, BPSG, USG, or the like, and may be deposited by any suitable method, such as CVD or PECVD. At least one of contact openings 91 and 93 are then formed using suitable photolithography and etching processes. Contact opening 91 is formed through the second ILD 95 to expose the replacement gate 97. Contact openings 93 are formed through the first ILD 90 and the second ILD 95 to expose source/drain regions 80. Contact openings 91 and 93 may be formed simultaneously or sequentially.

Figure 14:
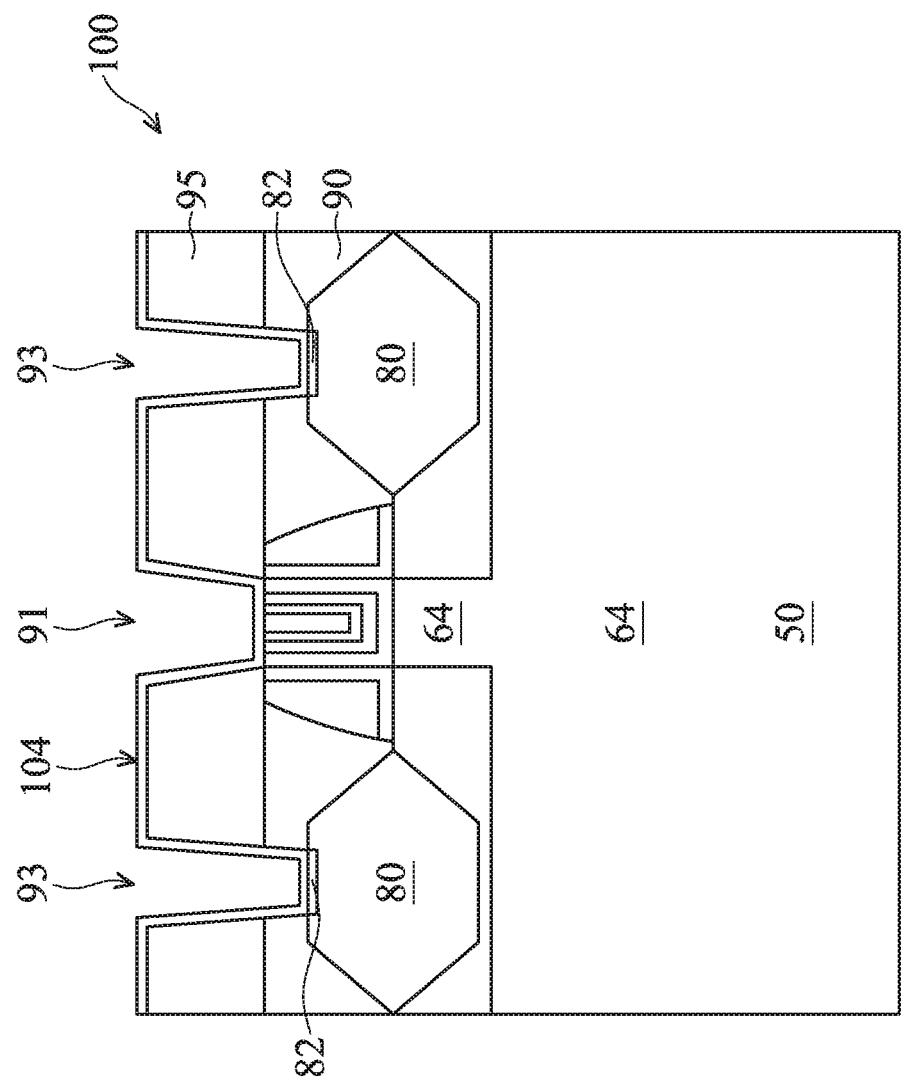

Next, in FIG. 14, silicide regions 82 are formed over the source/drain regions 80, and a barrier layer 104 is formed over the silicide regions 82 and the second ILD 95. In some embodiments, the silicide regions 82 are formed by depositing, over the source/drain regions 80, a metal capable of reacting with semiconductor materials (e.g., silicon, germanium) to form silicide or germanide regions. The metal may be nickel, cobalt, titanium, tantalum, platinum, tungsten, other noble metals, other refractory metals, rare earth metals, or their alloys. A thermal anneal process is then performed so that the deposited metal reacts with the source/drain regions 80 to form silicide regions 82. After the thermal anneal process, the unreacted metal is removed.

The barrier layer 104 is conformally formed over the silicide regions 82 and the second ILD 95, and lines sidewalls and bottoms of the contact openings 91 and 93. The barrier layer 104 may include an electrically conductive material such as titanium nitride, although other materials may be used such as tantalum nitride, titanium, tantalum, other materials, or combinations thereof. The barrier layer 104 may be formed using a CVD process, such as plasma-enhanced CVD (PECVD). However, other processes, such as sputtering, metal organic chemical vapor deposition (MOCVD), atomic layer deposition (ALD), or other processes, may also be used. In some embodiments, the barrier layer 104 may be formed having a thickness between about 10 Å and about 50 Å, though the barrier layer 104 may also be formed having another thickness. In some cases, the barrier layer 104 may act as a glue layer or adhesion layer.

Figure 15:
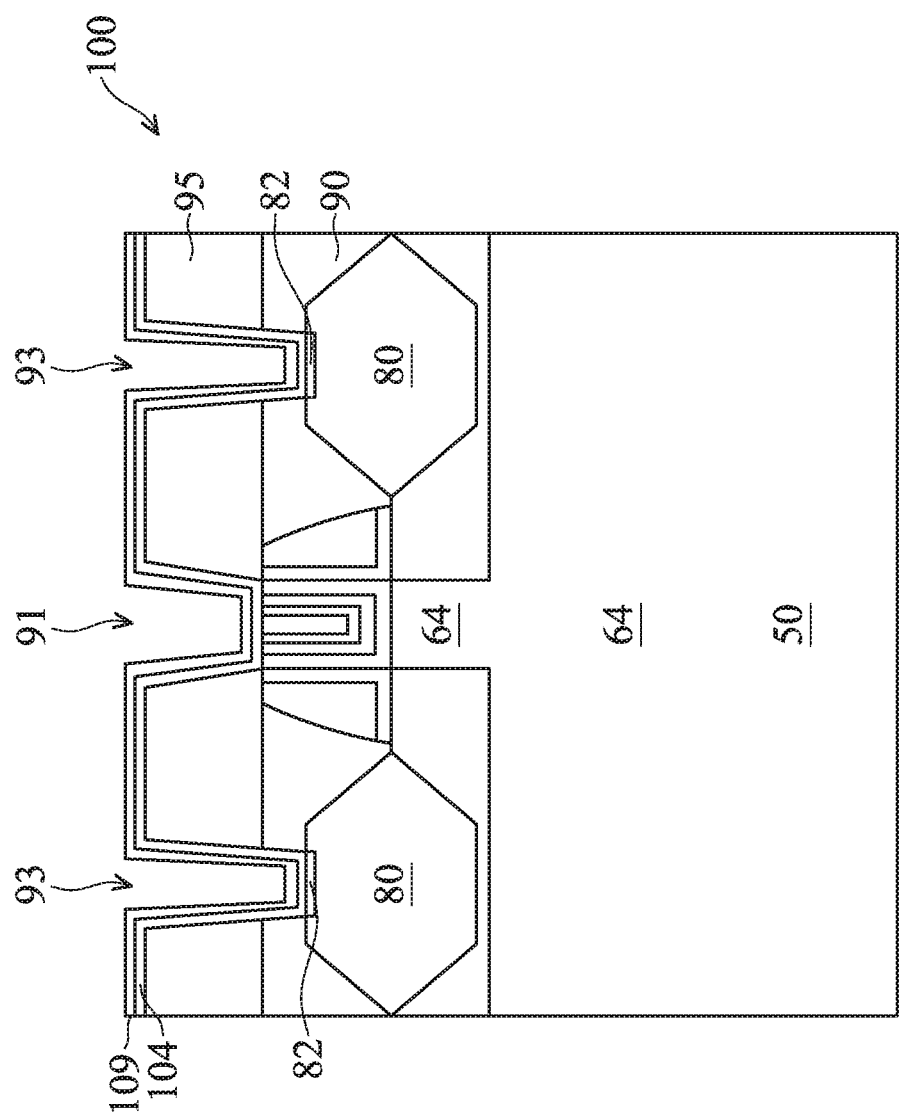

Next, in FIG. 15, a seed layer 109 is formed over the barrier layer 104. The seed layer 109 may be deposited by PVD, ALD or CVD, and may be formed of tungsten, copper, or copper alloys, although other suitable methods and materials may alternatively be used. The seed layer 109 may also be considered a nucleation layer. In some embodiments, the seed layer 109 is tungsten (W) deposited by an ALD process. In some cases, the tungsten seed layer 109 may be formed in an ALD process using one or more process gases including tungsten hexafluoride ($WF_6$), diborane ($B_2H_6$), silane ($SiH_4$), hydrogen ($H_2$), or other process gases. In some cases, the process gases may have a flow rate between about 30 sccm and about 400 sccm. The ALD process may be performed at a pressure between about 1 Torr and about 10 Torr, and at a temperature between about 250° C. and about 350° C. In some embodiments, the seed layer 109 may be formed having a thickness between about 20 Å and about 50 Å, though the seed layer 109 may also be formed having another thickness.

In some cases, impurities may remain in the seed layer 109 after formation. For example, boron impurities may remain in a tungsten seed layer that is formed using diborane as a process gas. In some cases, a tungsten seed layer may have an atomic percent of boron of between about 20 at. % and about 40 at. %. In other cases other impurities such as oxygen may be present in the seed layer 109. The presence of impurities in a seed layer (e.g., boron in a tungsten layer) may increase the resistance of that seed layer, which may reduce performance or efficiency of the final processed device. The presence of impurities may also be problematic for subsequent processing steps, discussed below with respect to FIG. 21.

Figure 16:
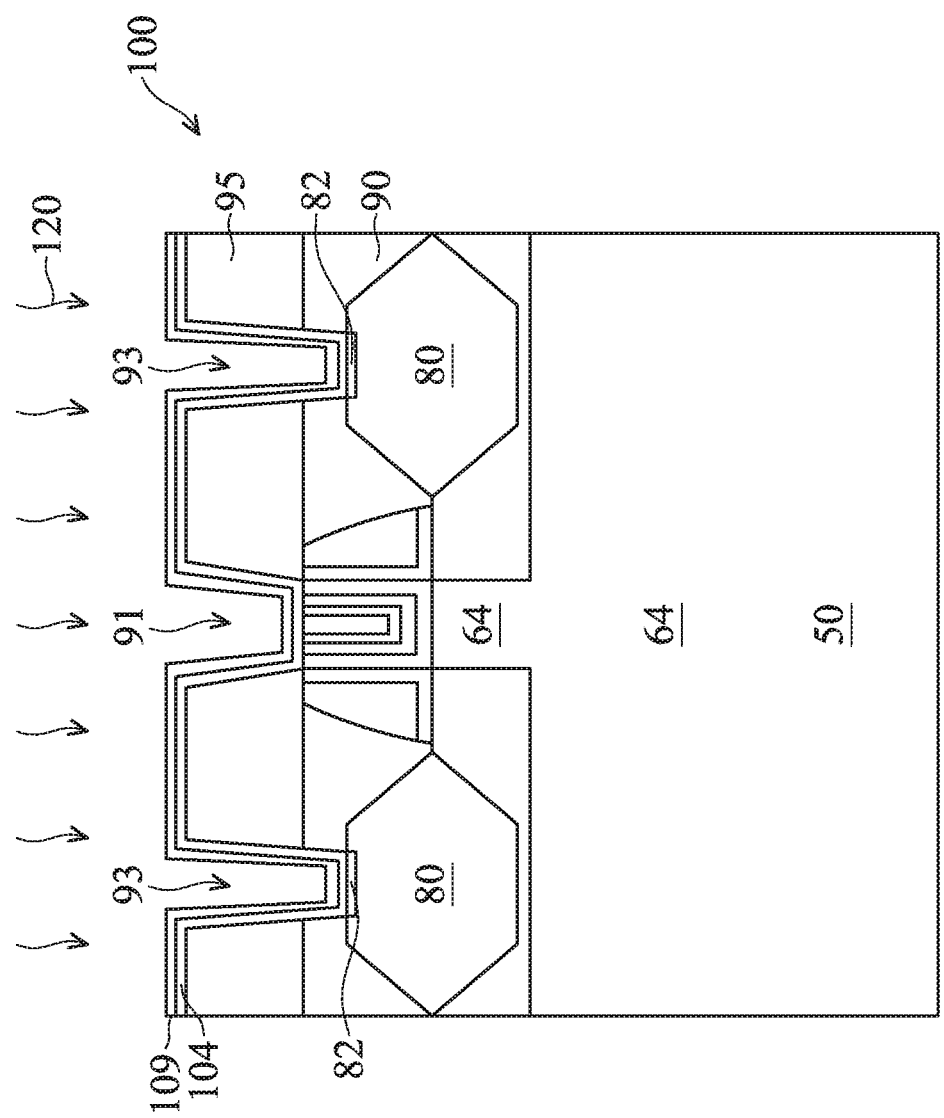

Turning to FIG. 16, a plasma treatment process 120 may be performed on the seed layer 109 to reduce the amount of impurities present in the seed layer 109. For example, the plasma treatment process 120 may reduce the concentration of boron or oxygen impurities present in portions of a tungsten seed layer. The use of a plasma treatment process 120 such as described herein may reduce impurities in a conductive layer, which may improve the conductive properties of that layer. For example, by reducing the amount of impurities in a seed layer, the resistance of the seed layer may also be reduced. In this manner, the efficiency, power consumption, or high-speed performance of a device may be improved due to decreased resistance.

In some embodiments, the plasma treatment process 120 includes exposing the seed layer 109 to a plasma ignited from a treatment gas. The treatment gas may include, for example, hydrogen ($H_2$), ammonia ($NH_3$), argon (Ar), another gas, or a combination of gases. In some embodiments, the plasma treatment process 120 is performed in a processing chamber with the treatment gas being supplied into the processing chamber. Carrier gases, such as nitrogen, argon, helium, xenon, or the like, may be used to carry the treatment gas into the processing chamber. The plasma treatment process 120 may be performed at a temperature between about 250° C. and about 500° C., such as about 300° C. A pressure in the processing chamber may be between about 1 Torr and about 50 Torr. The plasma treatment process 120 may be performed for a pre-determined duration, such as between about 5 seconds and about 90 seconds. By controlling these parameters, the impurity removal from the seed layer 109 may be adjusted. For example, the impurity removal distance into the contact openings 91 or 93 (i.e., depth D1, described below) may be controlled. Additionally, the overall amount of impurities removed may be controlled via these parameters. For example, more impurities may be removed by performing the plasma treatment process 120 for a longer duration of time. The parameters may also be adjusted to avoid damaging the seed layer 109 or other features. In some embodiments where the treatment gas includes a mixture of $H_2$ and $NH_3$, a flow rate of $H_2$ is between about 1000 sccm and about 8000 sccm, and a flow rate of $NH_3$ is between about 20 sccm and about 700 sccm. In some embodiments, the plasma is a remote plasma that is generated in a separate plasma generation chamber connected to the processing chamber. The treatment gas may be activated into plasma by any suitable method of generating the plasma, such as transformer coupled plasma generator, inductively coupled plasma systems, magnetically enhanced reactive ion techniques, electron cyclotron resonance techniques, or the like.

Figure 17:
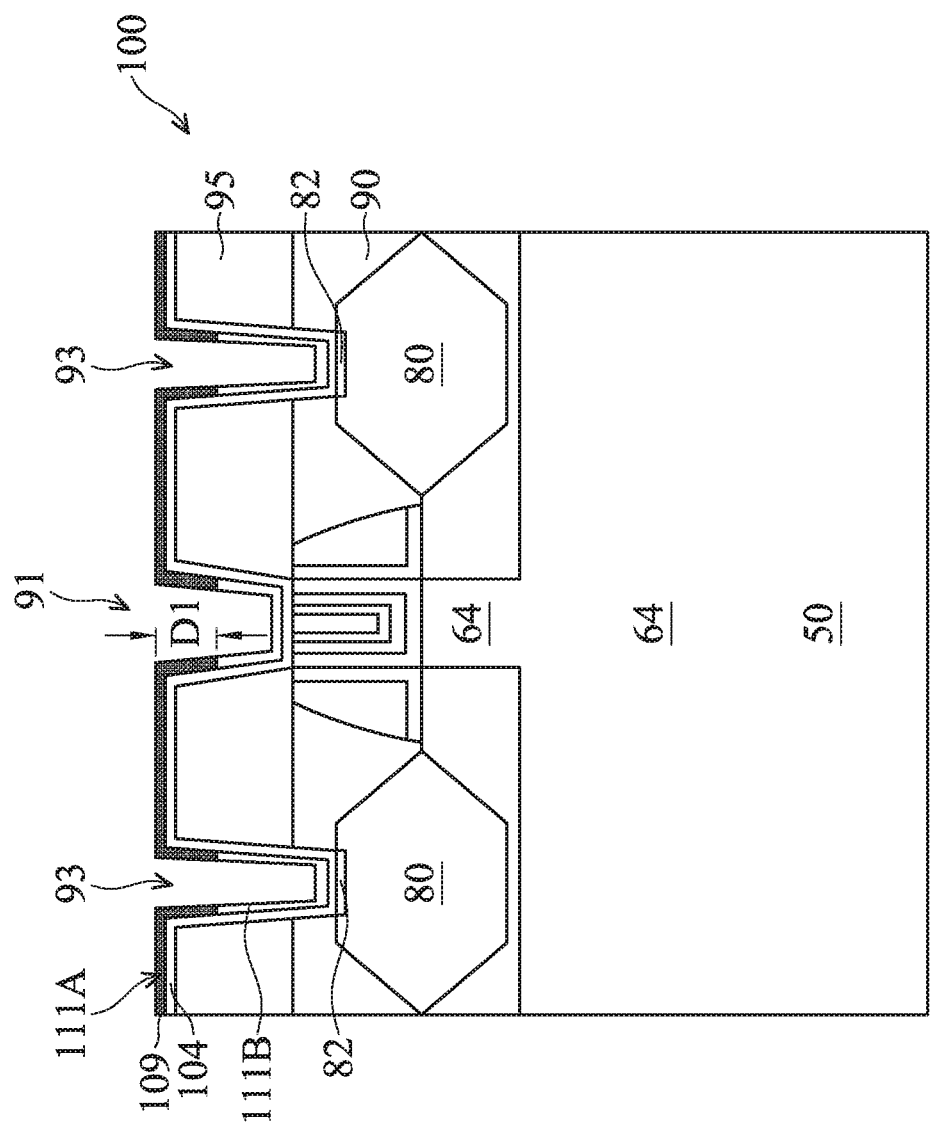

FIG. 17 illustrates the seed layer 109 after the plasma treatment process 120 in which impurities have been removed from an upper portion 111A of the seed layer 109 by the plasma treatment process 120. As shown in FIG. 17, the plasma treatment process 120 may remove some or all of the impurities within an upper portion 111A of the seed layer 109 while removing few or none of the impurities within a lower portion 111B of the seed layer 109. In some embodiments, the plasma treatment process 120 may reduce the concentration of impurities in an upper portion 111A by between about 5% and about 20%. In some cases, the plasma treatment process 120 may remove impurities from an upper portion 111A of the seed layer 109 that extends a depth D1 from a top surface of the seed layer 109, as shown in FIG. 17. The depth D1 may be a depth between about 20 nm and about 100 nm in some embodiments. In some embodiments, the vertical height of the upper portion 111A (i.e., depth D1) may be between about 10% and about 50% of the vertical height of the seed layer 109 (i.e., upper portion 111A and lower portion 111B combined). In some cases, impurities may be removed from multiple portions having different depths.

FIG. 17 illustrates an abrupt interface between an example upper portion 111A having more impurities removed and an example lower portion 111B having fewer impurities removed, but an interface between an upper portion 111A and a lower portion 111B may be gradual, discontinuous, irregular, etc. in other cases. For example, a distribution of removed impurities in seed layer 109 may be a gradient, have one or more steps, be irregular, etc. in some cases. In some embodiments, the plasma treatment process 120 may remove impurities from the entirety of seed layer 109. In some embodiments, the plasma treatment process 120 may remove impurities from top portions of the seed layer 109 (i.e., those over top surfaces of the second ILD 95) while not removing impurities from portions of the seed layer 109 within openings 91, 93. In some embodiments, the amounts and distributions of impurity removal may be adjusted by controlling parameters of the plasma treatment process 120, such as plasma power, flow rate of the treatment gas, duration of the plasma exposure, temperature, etc. In this manner, the plasma treatment process 120 may remove different amounts of impurities from different portions of a conductive layer such as a seed layer.

Figure 18:
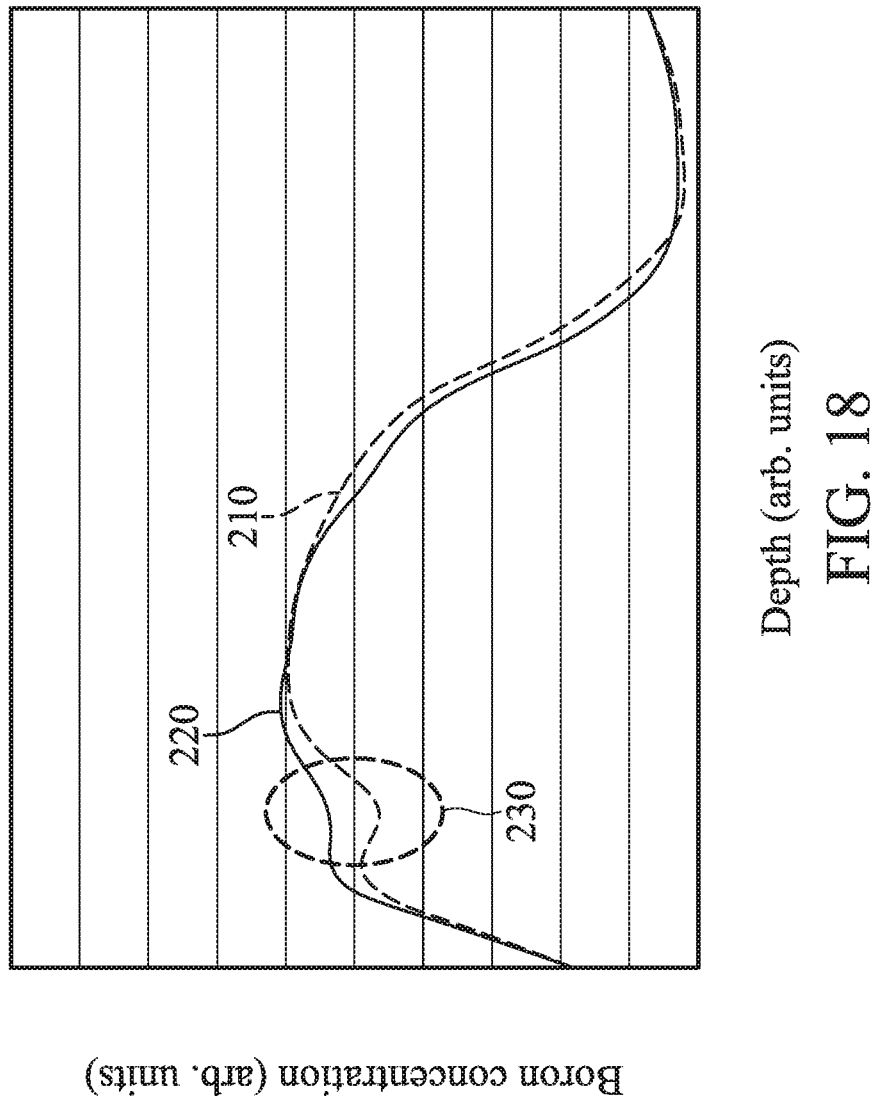
FIG. 18 illustrates depth-profile measurements of impurity concentration, in accordance with some embodiments.

FIG. 18 illustrates example measurements of impurity concentration in a seed layer. The curves 210 and 220 are measurements of relative boron concentration versus depth of two samples. Curves 210 and 220 were measured using the technique of X-ray photoelectron spectroscopy (XPS) combined with sputtering. The region 230 indicated in FIG. 18 corresponds to the location of a tungsten seed layer. For the sample of curve 210, a plasma treatment process was performed on the tungsten seed layer. For the sample of curve 220, no plasma treatment process was performed on the tungsten seed layer. As shown in FIG. 18, the curve 210 with the plasma treatment has less boron impurities in the tungsten seed layer than the curve 220 without the plasma treatment. For the example shown in FIG. 18, in some instances, the plasma treatment process has reduced the concentration of boron impurities as much as approximately 10-15%. The curves 210 and 220 shown in FIG. 18 are an illustrative example, and a plasma treatment process such as that described herein may reduce a impurity concentration a different amount in other cases.

Figure 19:
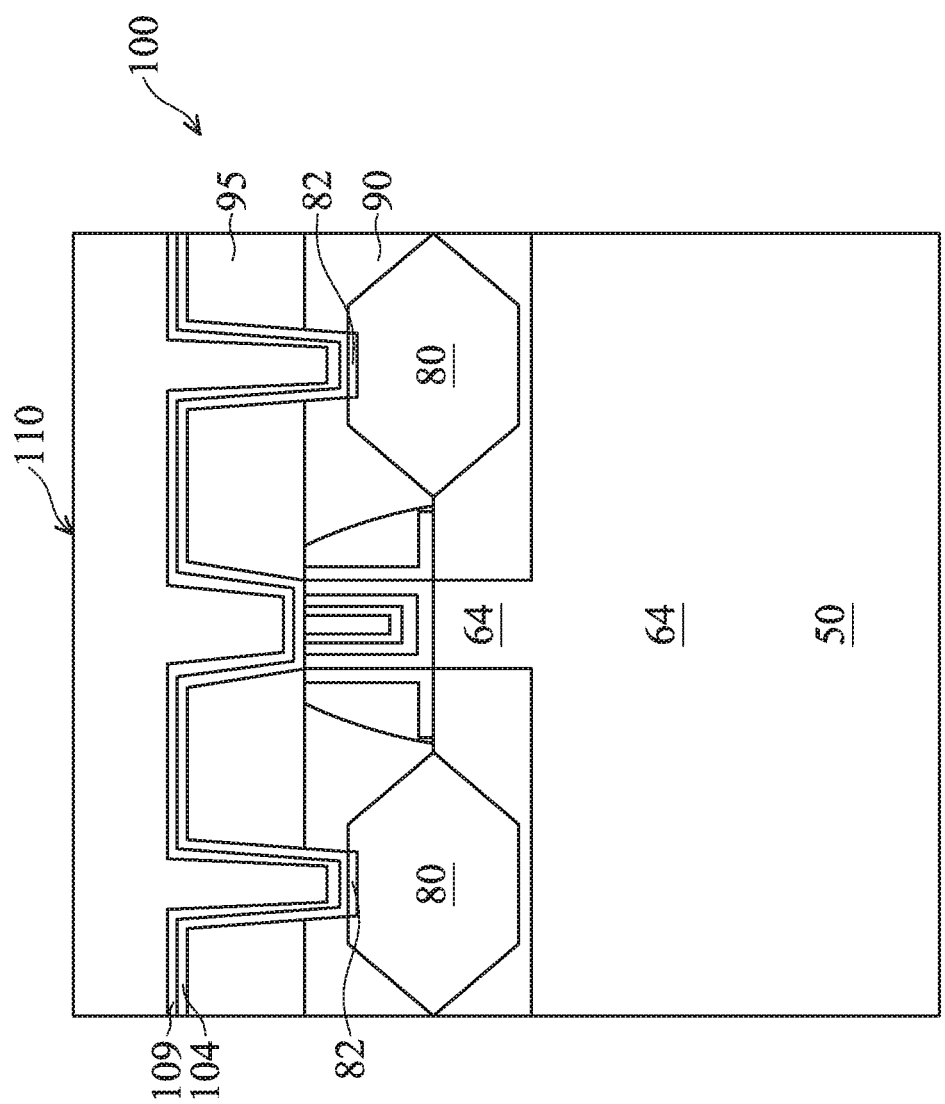
Figure 20A:
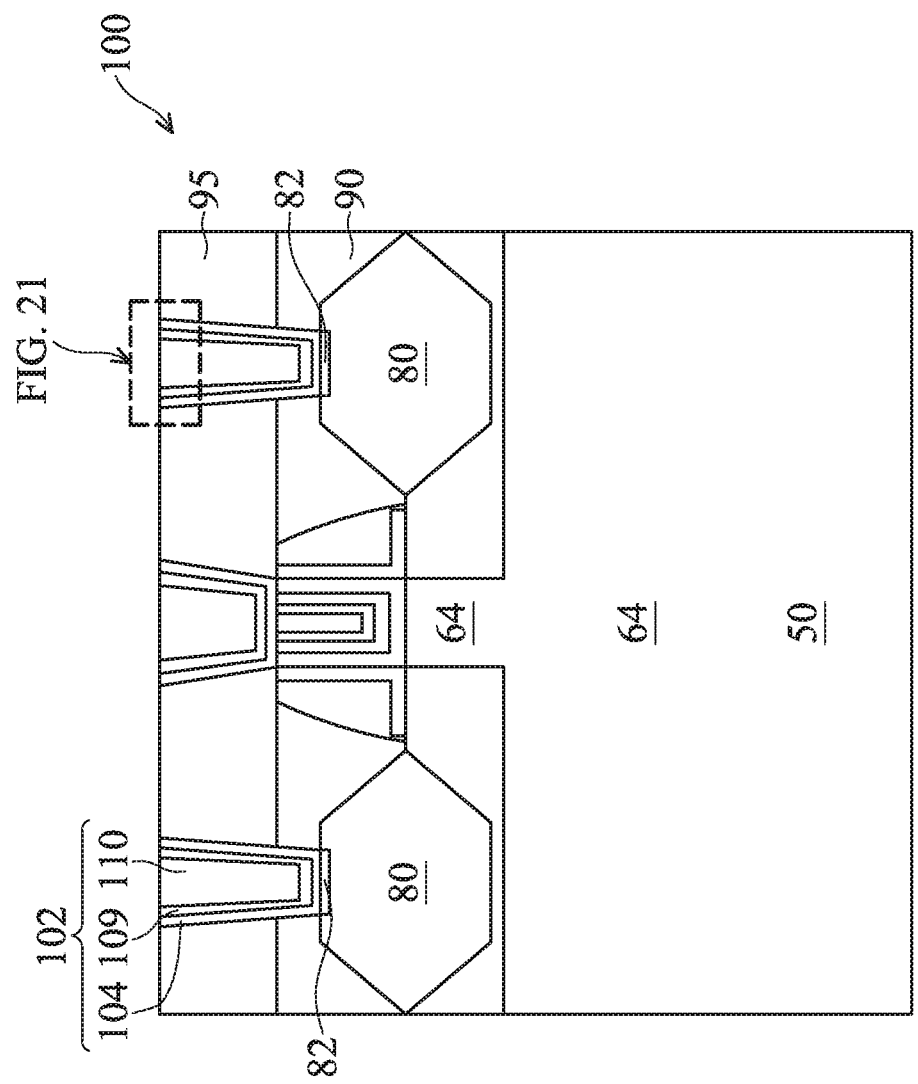

Turning to FIG. 19, once the seed layer 109 has been formed, a conductive material 110 may be formed onto the seed layer 109 to fill the contact openings 91/93. The conductive material 110 may include tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may also be used. Any suitable deposition method may be used to form the conductive material 110, such as PVD, CVD, ALD, plating (e.g., electroplating), reflow, or another method.

Referring next to FIG. 20A, once the contact openings 91/93 have been filled, excess barrier layer 104, seed layer 109, and conductive material 110 outside of the contact openings 91/93 are removed through a planarization process such as CMP, although any suitable removal process may be used. Contact plugs 102 are thus formed in the contact openings 91/93. Although contact plugs 102 over the source/drain regions 80 and over the replacement gate 97 are illustrated in a same cross-section in FIG. 20A, the contact plugs 102 may be in different cross-sections in the FinFET device 100.

FIG. 20B illustrates the cross-sectional view of the FinFET device 100 shown in FIG. 20A, but along cross-section B-B, in some embodiments. In FIG. 20B, a first replacement gate 99A (including a gate dielectric 96, barrier layer 94, seed layer 92, and gate fill 98A) is formed over the fin 64A, and a second replacement gate 99B (including a gate dielectric 96, barrier layer 94, seed layer 92, and gate fill 98B) is formed over the fin 64B. The first replacement gate 99A is separated from the second replacement gate 99B by the first ILD 90. In the example shown in FIG. 20B, one contact plug 102 is electrically coupled to the gate fill 98A, and another contact plug 102 is electrically coupled to the gate fill 98B.

Although not shown, the gate spacers 74 (see, for example, FIG. 10) may be formed between the replacement gates 99A and 99B and the first ILD 90 in the cross-sectional view of FIG. 20B. For example, the gate spacers 74 may be formed along the two sidewalls of the first replacement gate 99A and along the two sidewalls of the second replacement gate 99B in the cross-sectional view of FIG. 20B. In such embodiments, the gate spacers 74 may be formed between the first replacement gate 99A and the second replacement gate 99B. In some embodiments, the gate spacers 74 are not formed between the first replacement gate 99A and the second replacement gate 99B, but are formed on exterior sidewalls (e.g., the leftmost sidewall of the first replacement gate 99A and the rightmost sidewall of the second replacement gate 99B in FIG. 20B) of the replacement gates 99A and 99B. In yet other embodiments, the gate spacers 74 are not formed in the cross-sectional view of FIG. 20B. These and other variations of the gate spacers 74 are fully intended to be included within the scope of the present disclosure.

Variations and modifications to the present disclosure are possible and are fully intended to be included within the scope of the present disclosure. For example, more than one fins may be formed in each of the regions 200 and 300, and more than one gates may be formed over the fins 64. The formation of the fins 64 may include other processing steps, and the materials of the fins 64A and 64B may or may not be the same. In addition, in the replacement gate process discussed above, dummy gate structures 75A and 75B are separated from each other before being replaced by replacement gates 97. In other embodiments, it is possible to form a dummy gate structure that extends continuously from the fin 64A to the fin 64B, then replacing the dummy gate structure with a replacement gate that extends continuously from the fin 64A to the fin 64B, and subsequently, the replacement gate is cut (e.g., by etching an opening between the fins 64A and 64B, and filling the opening with a dielectric material) to form two separate replacement gates (one on each of the fins 64A and 64B). These and other variations are fully intended to be included within the scope of the present disclosure.

Turning to FIG. 21, a portion of an example contact plug after planarization is shown. For example, FIG. 21 may show a portion of contact plug 102 as indicated by the labeled box in FIG. 20A. In some cases, during a CMP process, a metal layer with a higher concentration of impurities may be removed at a greater rate than a metal layer with a lower concentration of impurities. For example, a greater concentration of boron impurities in a tungsten seed layer can increase the removal rate of the tungsten seed layer during a CMP process. Due to the increased removal rate, pits or recesses may form in the metal layer in locations where an excess of the metal layer has removed. For example, the seed layer 109 shown in FIG. 21 has recesses 113 formed during a planarization process, such as that described above with respect to FIGS. 20A-B. In some cases, recesses in a seed layer can reduce the contact area between the seed layer and a conductive material formed on the seed layer, which can increase resistance. Additionally, recesses in a seed layer can cause subsequent processing defects. For example, subsequently deposited material may not fully fill the recesses, or the recesses may result in overetching of the recessed portions of the seed layer.

Accordingly, by reducing the amount of impurities in a seed layer using the plasma treatment process as described herein, recesses formed in the seed layer during planarization may be reduced or eliminated. For example, plasma treatment process 120 may reduce the concentration of impurities in seed layer 109 such that a depth D2 of recesses 113 is reduced. In some cases, recesses 113 in a plasma-treated seed layer 109 may have a depth D2 of about 2 nm or less. In this manner, reducing the impurities in a seed layer using a plasma treatment process may also improve process uniformity and reduce the risk of process defects.

Embodiments may achieve advantages. By reducing impurities in a seed layer using a plasma treatment process, the resistance of the seed layer may be reduced. Reducing the resistance in this manner may improve device performance, efficiency, and speed. Reducing impurities in a seed layer may also reduce processing defects, and thus can improve yield. The techniques described herein may be used to during the processing of any suitable conductive feature, such as conductive lines, plugs, contacts, or the like.

In an embodiment, a method includes forming an opening in a dielectric layer, depositing a seed layer in the opening, wherein first portions of the seed layer have a first concentration of impurities, exposing the first portions of the seed layer to a plasma, wherein after exposure to the plasma the first portions have a second concentration of impurities that is less than the first concentration of impurities, and filling the opening with a conductive material to form a conductive feature. In an embodiment, the seed layer includes tungsten. In an embodiment, depositing the seed layer includes using an Atomic Layer Deposition (ALD) process. In an embodiment, the ALD process uses $B_2H_6$ as a process gas. In an embodiment, the impurities include boron. In an embodiment, the plasma includes a plasma of ammonia ($NH_3$). In an embodiment, the conductive material includes tungsten. In an embodiment, the method further includes depositing a barrier layer in the opening. In an embodiment, the method further includes planarizing the seed layer and the conductive material. In an embodiment, the conductive feature is a FinFET gate contact.

In an embodiment, a method includes forming a dielectric material over a substrate, forming an opening in the dielectric material, forming a conductive seed layer in the opening and over the dielectric material, removing impurities from first portions of the seed layer, forming a conductive material in the opening and over the first portions of the seed layer, and performing a planarization process to remove second portions of the seed layer disposed over the dielectric material. In an embodiment, the seed layer comprises tungsten. In an embodiment, the impurities comprise boron. In an embodiment, removing impurities from first portions of the seed layer includes igniting a treatment gas into a plasma and exposing the first portions of the seed layer to the plasma. In an embodiment, the treatment gas includes ammonia ($NH_3$).

In an embodiment, a semiconductor device includes a dielectric layer and a contact plug in the dielectric layer. The contact plug includes a conductive material and a conductive layer along sidewalls of the conductive material, a first portion of the conductive layer proximal a first end of the conductive material including a first concentration of impurities, a second portion of the conductive layer proximal a second end of the conductive material including a second concentration of impurities, wherein the first end of the conductive material is opposite the second end of the conductive material, and wherein the second concentration of impurities is less than the first concentration of impurities. In an embodiment, the contact plug is a source/drain contact of a FinFET device. In an embodiment, the conductive layer is a nucleation layer. In an embodiment, the impurities include boron. In an embodiment, the conductive layer includes tungsten.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming an opening in a dielectric layer;
    depositing a seed layer in the opening, the seed layer comprising first portions and second portions, wherein the first portions of the seed layer are closer to a top surface of the dielectric layer than the second portions of the seed layer, wherein the first portions of the seed layer have a first concentration of impurities, and wherein the second portions of the seed layer have the first concentration of impurities;
    exposing the first portions of the seed layer to a plasma, wherein after exposing the first portions of the seed layer to the plasma the first portions have a second concentration of impurities that is less than the first concentration of impurities and the second portions of the seed layer have the first concentration of impurities;
    filling the opening with a conductive material to form a conductive feature; and
    after filling the opening with the conductive material, performing a planarization process to remove regions of the conductive material and the seed layer, wherein the planarization process forms recesses extending into the first portions of the seed layer.

2. The method of claim 1, wherein the seed layer comprises tungsten.

3. The method of claim 1, wherein depositing the seed layer comprises using an Atomic Layer Deposition (ALD) process.

4. The method of claim 3, wherein the ALD process uses $B_2H_6$ as a process gas.

5. The method of claim 1, wherein the first concentration of impurities is between about 5% and about 20% greater than the second concentration of impurities.

6. The method of claim 1, wherein the plasma comprises plasma of ammonia ($NH_3$).

7. The method of claim 1, wherein the conductive material comprises tungsten.

8. The method of claim 1, further comprising depositing a barrier layer in the opening.

9. The method of claim 1, wherein the first portions of the seed layer are exposed to the plasma at a temperature between about 250° C. and about 500° C.

10. The method of claim 1, wherein the recesses extend between 1 nm and 2 nm into the first portions of the seed layer.

11. A method comprising:
forming a dielectric material over a substrate;
forming an opening in the dielectric material;
forming a conductive seed layer in the opening and over the dielectric material, the seed layer comprising first portions in the opening and second portions over the dielectric material, wherein the second portions extend into the opening;
removing impurities from the first portions of the seed layer and from the second portions of the seed layer, wherein a greater amount of impurities are removed from the second portions than from the first portions;
forming a conductive material in the opening and over the first portions of the seed layer; and
performing a planarization process to remove second portions of the seed layer over a top surface of the dielectric material, wherein the planarization process also removes second portions of the seed layer extending into the opening below the top surface of the dielectric material.

12. The method of claim 11, wherein the second portions of the seed layer extend into the opening a distance between about 20 nm and about 100 nm.

13. The method of claim 11, wherein the impurities comprise boron.

14. The method of claim 11, wherein removing impurities from the second portions of the seed layer comprises:
igniting a treatment gas into plasma; and
exposing the second portions of the seed layer to the plasma.

15. The method of claim 14, wherein the treatment gas comprises ammonia ($NH_3$).

16. A method comprising:
forming a semiconductor fin on a substrate;
forming a source/drain region in the semiconductor fin;
depositing a dielectric layer over the source/drain region;
forming an opening in the dielectric layer to expose portions of the source/drain region; and
forming a contact plug in the opening, comprising:
depositing a first conductive material over surfaces of the dielectric layer and over the exposed portions of the source/drain region, the first conductive material comprising a first region and a second region, the first region being farther from the substrate than the second region;
performing a plasma treatment process on the first conductive material, wherein after performing the plasma treatment process, the first region of the first conductive material has a lower concentration of impurities than the second region;
after performing the plasma treatment process, depositing a second conductive material on the first conductive material; and
performing a Chemical-Mechanical Polish (CMP) on the first conductive material and the second conductive material, wherein after performing the CMP, a top surface of the first conductive material is closer to the substrate than a top surface of the second conductive material.

17. The method of claim 16, further comprising depositing a barrier layer over surfaces of the dielectric layer and over the exposed portions of the source/drain region prior to depositing the first conductive material.

18. The method of claim 16, wherein the first conductive material comprises a nucleation layer.

19. The method of claim 16, wherein the impurities comprise boron.

20. The method of claim 16, wherein the second conductive material comprises tungsten.

* * * * *